(12) United States Patent
Yoo et al.

(10) Patent No.: US 9,755,026 B2
(45) Date of Patent: Sep. 5, 2017

(54) METHOD OF MANUFACTURING SEMICONDUCTOR DEVICE

(71) Applicant: Samsung Electronics Co., Ltd., Suwon-si, Gyeonggi-do (KR)

(72) Inventors: Dong Su Yoo, Hwaseong-si (KR); WeonHong Kim, Suwon-si (KR); Moonkyun Song, Anyang-si (KR); Minjoo Lee, Seoul (KR); Soojung Choi, Yangju-si (KR)

(73) Assignee: Samsung Electronics Co., Ltd. (KR)

( * ) Notice: Subject to any disclaimer, the term of this patent is extended or adjusted under 35 U.S.C. 154(b) by 17 days.

(21) Appl. No.: 15/132,800

(22) Filed: Apr. 19, 2016

(65) Prior Publication Data

US 2017/0062572 A1    Mar. 2, 2017

(30) Foreign Application Priority Data

Aug. 24, 2015 (KR) .................. 10-2015-0118992

(51) Int. Cl.

| | |
|---|---|
| *H01L 29/40* | (2006.01) |
| *H01L 29/423* | (2006.01) |
| *H01L 21/441* | (2006.01) |
| *H01L 29/66* | (2006.01) |
| *H01L 21/3105* | (2006.01) |
| *H01L 21/762* | (2006.01) |
| *H01L 21/321* | (2006.01) |

(52) U.S. Cl.
CPC ........ *H01L 29/401* (2013.01); *H01L 21/3105* (2013.01); *H01L 21/32105* (2013.01); *H01L 21/441* (2013.01); *H01L 21/762* (2013.01); *H01L 29/4236* (2013.01); *H01L 29/6653* (2013.01); *H01L 29/66553* (2013.01); *H01L 29/66795* (2013.01)

(58) Field of Classification Search
CPC .............. H01L 29/401; H01L 21/3105; H01L 21/32105
See application file for complete search history.

(56) References Cited

U.S. PATENT DOCUMENTS

| | | | |
|---|---|---|---|
| 6,806,145 B2 | 10/2004 | Haukka et al. | |
| 6,809,370 B1 * | 10/2004 | Colombo | .......... H01L 21/28185 257/310 |
| 7,335,587 B2 | 2/2008 | Johnston et al. | |
| 8,158,521 B2 | 4/2012 | Chang et al. | |
| 8,334,197 B2 | 12/2012 | Lee et al. | |
| 8,481,106 B2 | 7/2013 | Mukherjee et al. | |

(Continued)

*Primary Examiner* — Errol Fernandes
(74) *Attorney, Agent, or Firm* — Ward and Smith, P.A.

(57) ABSTRACT

A method of forming a semiconductor device includes forming a sacrificial gate pattern on an active pattern, forming spacers on opposite sidewalls of the sacrificial gate pattern, forming an interlayer insulating layer on the active pattern and the spacers, removing the sacrificial gate pattern to form a gate trench that exposes a region of the active pattern, forming a gate dielectric layer on the region of the active pattern exposed by the gate trench, performing a first heat treatment at a pressure of less than 1 atm to remove impurities in the interlayer insulating layer, performing a second heat treatment on the gate dielectric layer at a temperature greater than a temperature of the first heat treatment, and forming a gate electrode in the gate trench.

20 Claims, 24 Drawing Sheets

(56) References Cited

U.S. PATENT DOCUMENTS

| | | | |
|---|---|---|---|
| 8,809,175 B2 | 8/2014 | Tsai et al. | |
| 9,006,056 B2 | 4/2015 | Yao et al. | |
| 9,041,118 B2 | 5/2015 | Ando et al. | |
| 9,099,461 B2 | 8/2015 | Chudzik et al. | |
| 9,105,570 B2 | 8/2015 | Su et al. | |
| 9,142,404 B2 | 9/2015 | Tsai et al. | |
| 2004/0004247 A1* | 1/2004 | Forbes | G11C 11/5671 257/324 |
| 2004/0129995 A1* | 7/2004 | Yeo | H01L 27/088 257/500 |
| 2005/0156256 A1* | 7/2005 | Kim | C23C 16/40 257/410 |
| 2007/0212896 A1* | 9/2007 | Olsen | H01J 37/32082 438/758 |
| 2008/0242114 A1* | 10/2008 | Quevedo-Lopez | H01L 21/3105 438/785 |
| 2009/0035928 A1 | 2/2009 | Hegde et al. | |
| 2009/0108294 A1 | 4/2009 | Choi et al. | |
| 2015/0035079 A1 | 2/2015 | Xie | |
| 2015/0087144 A1 | 3/2015 | Liu et al. | |
| 2015/0126020 A1 | 5/2015 | Ando et al. | |

* cited by examiner

METHOD OF MANUFACTURING SEMICONDUCTOR DEVICE

CROSS-REFERENCE TO RELATED APPLICATIONS

This application claims priority under 35 U.S.C. §119(a) to Korean Patent Application No. 10-2015-0118992, filed on Aug. 24, 2015, in the Korean Intellectual Property Office, the disclosure of which is incorporated by reference in its entirety herein.

BACKGROUND

The inventive concepts disclosed herein relate to methods for manufacturing semiconductor devices, and more particularly, to methods for manufacturing semiconductor device using heat treatment in a vacuum at a low temperature.

Semiconductor devices include memory devices that store data, logic devices that process data, and hybrid devices that include both memory and logic elements. To meet the increased demand for electronic devices with high speed and/or low power consumption, it is desirable to manufacture semiconductor devices with high reliability, high performance, and/or high functionality. To satisfy these technical requirements, the complexity and/or integration density of semiconductor devices are being increased.

SUMMARY

Example embodiments provide a method of manufacturing a semiconductor device with improved reliability by a heat treatment in a vacuum at a low temperature.

According to example embodiments, a method of forming a semiconductor device may include forming a device isolation layer defining an active pattern on an upper portion of a substrate, forming a sacrificial gate pattern across the active pattern, forming spacers on opposite sidewalls of the sacrificial gate pattern, forming a interlayer insulating layer on the active pattern and the spacers, forming a gate trench defined by the spacers after removing the sacrificial gate pattern, the gate trench exposing a region of the active pattern, forming a gate dielectric layer on a region of the active pattern exposed by the gate trench, removing impurities in the interlayer insulating layer by performing a first heat treatment, performing a second heat treatment on the gate dielectric layer at a temperature greater than that of the first heat treatment, and forming a gate electrode in the gate trench. The first heat treatment may be performed at a pressure of less than 1 atm.

In example embodiments, forming the gate dielectric layer may include forming an interfacial layer on the region of the active pattern, and forming a high-k dielectric layer on the interfacial layer.

In example embodiments, forming the interfacial layer may include performing at least one of a thermal oxidation process and a chemical oxidation process on the region of the active pattern exposed by the gate trench, and growing the interfacial layer from the region of the active pattern exposed by the gate trench.

In example embodiments, the high-k dielectric layer may directly contact sidewalls of the spacers.

In example embodiments, performing the second heat treatment may include diffusing materials contained in the high-k dielectric layer into the interfacial layer.

In example embodiments, forming the high-k dielectric layer may include forming a first high-k dielectric layer and a second high-k dielectric layer on the first high-k dielectric layer. The second high-k dielectric layer may be formed after performing the second heat treatment.

In example embodiments, the method may further include performing a third heat treatment on the second high-k dielectric layer. The third heat treatment may be performed at a temperature greater than the temperature of the first heat treatment and lower than the temperature of the second heat treatment.

In example embodiments, the first heat treatment may be performed at a pressure ranging from 1 Torr to 40 Torr and at a temperature that is from 400° C. to 900° C.

In example embodiments, the impurities may include at least one of oxygen ($O_2$) and water vapor ($H_2O$).

In example embodiments, the second heat treatment may be performed at a temperature that is from 700° C. to 1200° C.

In example embodiments, a thickness of the gate dielectric layer may be additionally increased from 0.1 Å to 0.5 Å during performing the second heat treatment.

In example embodiments, the active pattern may include an active fin protruding between the device isolation layers.

According to example embodiments, a method of manufacturing a semiconductor device may include forming an interlayer insulating layer on an active pattern of a substrate, forming a gate trench exposing a region of the active pattern in the interlayer insulating layer, sequentially forming an interfacial layer and a high-k dielectric layer on the region of the active pattern, and performing a first heat treatment at a pressure ranging from 1 Torr to 40 Torr and at a temperature that is from 400° C. to 900° C.

In example embodiments, performing the first heat treatment may include removal of at least one of oxygen ($O_2$) and water vapor ($H_2O$) in the interlayer insulating layer.

In example embodiments, the method may further include performing a second heat treatment on the high-k dielectric layer.

In example embodiments, the second heat treatment may be performed at an atmospheric pressure and at a temperature that is from 700° C. to 1200° C.

In example embodiments, the method may further include forming a device isolation trench defining the active pattern by etching an upper portion of the substrate before forming the interlayer insulating layer, and forming a device isolation layer filling the device isolation trench.

In example embodiments, the method may further include exposing an upper portion of the active pattern by recessing the device isolation layer.

According to example embodiments, a method of manufacturing a semiconductor device may include forming an interlayer insulating layer on an active pattern of a substrate, forming a gate trench exposing a region of the active pattern in the interlayer insulating layer, forming a gate dielectric layer covering the region of the active pattern, transferring the substrate to a load lock chamber which is under a vacuum, transferring the substrate from the load lock chamber to a process chamber and performing a first heat treatment on the substrate in the process chamber, and forming a gate electrode in the gate trench on the gate dielectric layer. A pressure within the process chamber may be controlled at a pressure ranging from 1 Torr to 40 Torr for performing the first heat treatment.

In example embodiment, the method may further include performing a second heat treatment on the substrate after performing the first heat treatment and releasing the vacuum in the load lock chamber.

BRIEF DESCRIPTION OF THE DRAWINGS

Features will become apparent to those of ordinary skill in the art by describing in detail exemplary embodiments with reference to the attached drawings, in which:

FIGS. 5A to 9A, 12A, and 13A are cross-sectional views taken along line I-I' of FIG. 2, which are illustrated to provide a description of a method of manufacturing a semiconductor device according to example embodiments.

FIGS. 5B to 9B, 12B, and 13B are cross-sectional views taken along line II-II' of FIG. 2, which are illustrated to provide a description of a method of manufacturing a semiconductor device according to example embodiments.

Figure 1:
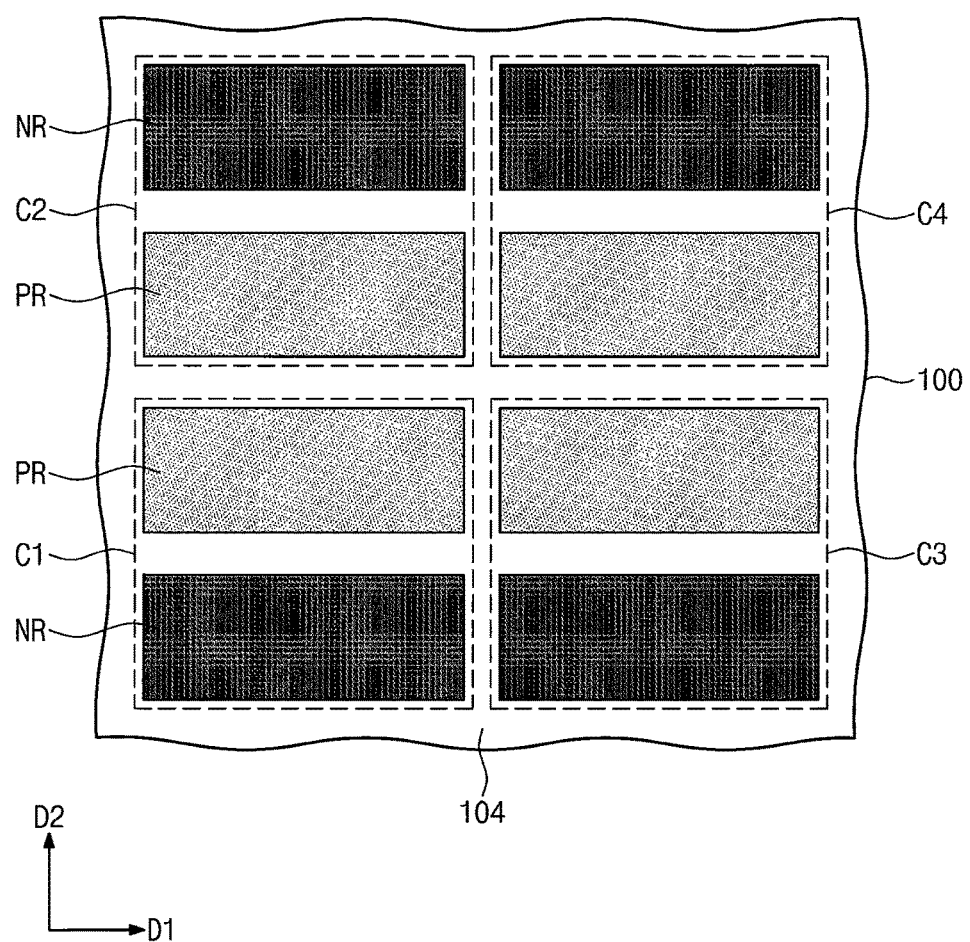
FIG. 1 is a plan view of a semiconductor device according to example embodiments.

It should be noted that these figures are intended to illustrate the general characteristics of methods, structure and/or materials utilized in certain example embodiments and to supplement the written description provided below. The relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully hereinafter with reference to the accompanying drawings, in which example embodiments are shown. Example embodiments may, however, be embodied in many different forms and should not be construed as being limited to those set forth herein; rather, these embodiments are provided so that this disclosure will be thorough and complete, and will fully convey the concept of exemplary implementations to those of skill in the art. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be further understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of skill in the art. It will be further understood that terms, such as those defined in commonly-used dictionaries, should be interpreted as having a meaning that is consistent with their meaning in the context of this specification and the relevant art and will not be interpreted in an idealized or overly formal sense unless expressly so defined herein.

FIG. 1 is a plan view of a semiconductor device according to some embodiments.

Referring to FIG. 1, a semiconductor device according to some embodiments may include a plurality of logic cells, e.g., first through fourth logic cells C1, C2, C3 and C4 provided on a substrate 100. Each of the logic cells C1, C2, C3 and C4 may include a plurality of transistors. As an example, the semiconductor device may include a first logic cell C1, a second logic cell C2 spaced apart from the first logic cell C1 in a first direction D1, a third logic cell spaced apart from the first logic cell C1 in a second direction D2 perpendicular to the first direction D1 and a fourth logic cell spaced apart from the second logic cell C2 in the second direction D2. Each of the logic cells C1, C2, C3 and C4 may include active regions separated from each other by device isolation layers 104. Each of the logic cells C1, C2, C3 and C4 may include a PMOSFET region PR and a NMOSFET region NR that are separated from each other by the device isolation layers 104.

As an example, the PMOSFET region PR and the NMOSFET region NR may be spaced apart from each other in the first direction D1. The PMOSFET region PR of the first logic cell C1 may be adjacent to the PMOSFET region PR of the second logic cell C2 in the first direction D1. In the description below, a logic cell may be referred to as a unit configured to perform a logical operation. The number of the logic cells in a semiconductor device may be different from that illustrated in the drawings.

Figure 2:
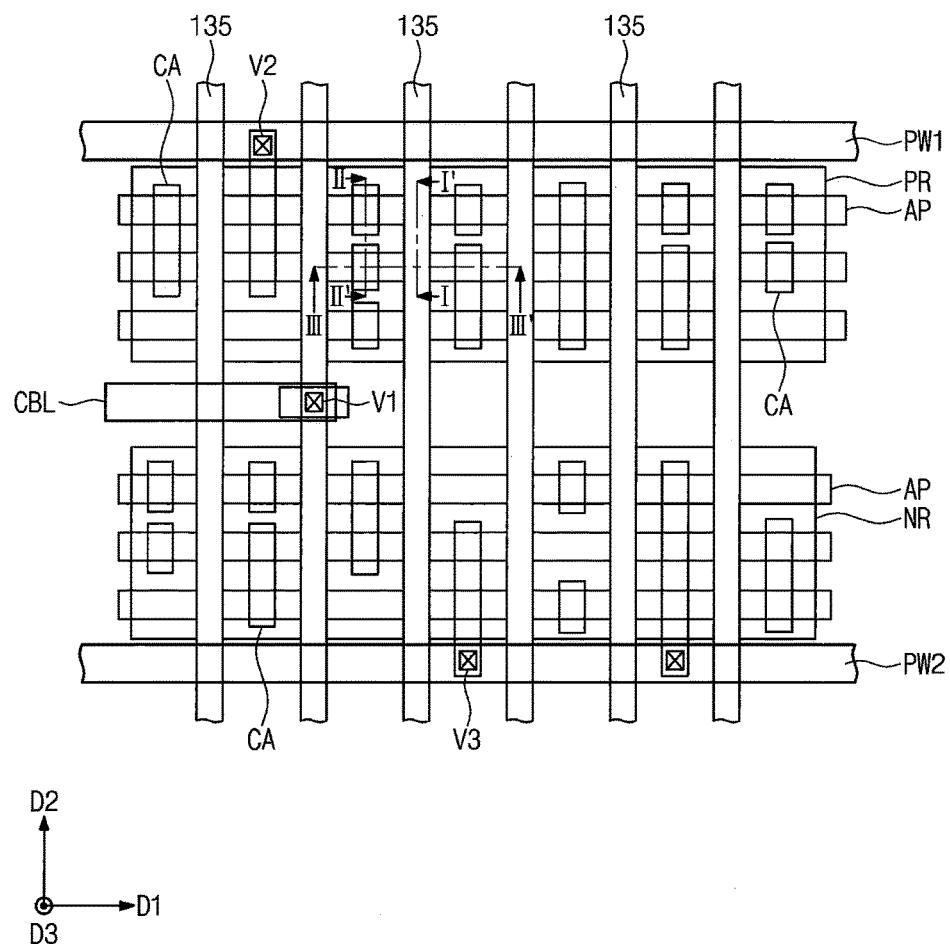
FIG. 2 is a plan view illustrating a semiconductor device according to example embodiments.
Figure 3A:
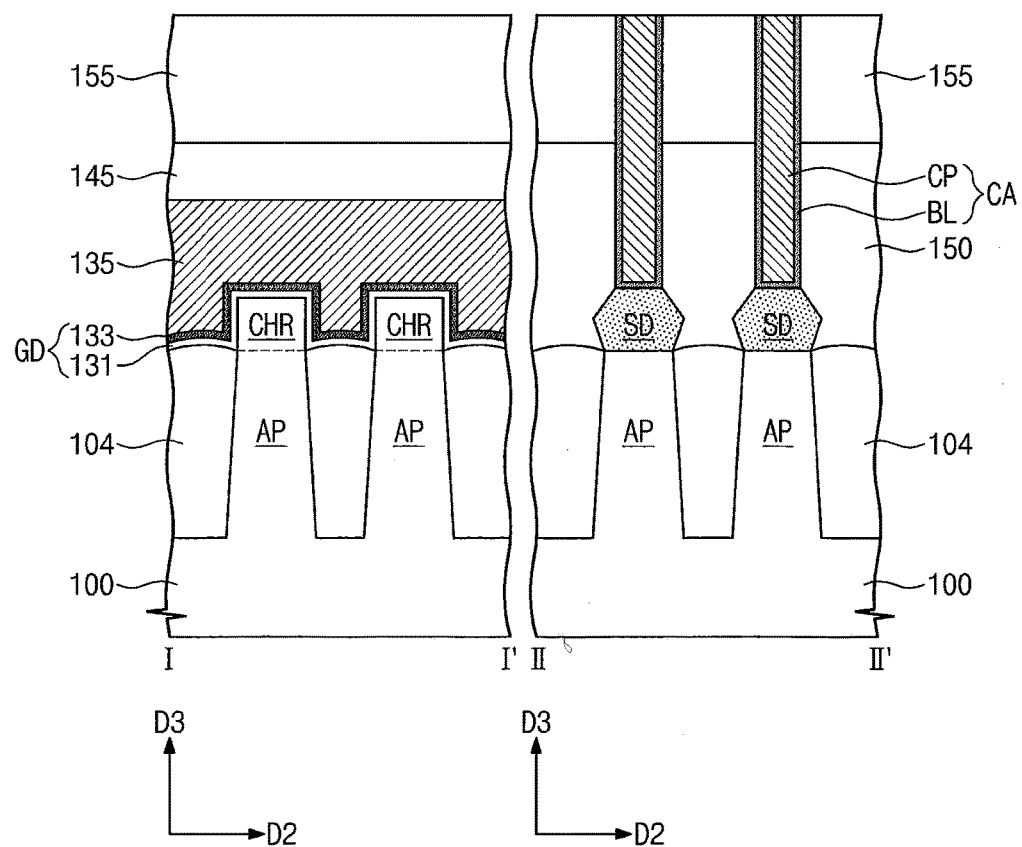
FIG. 3A is a cross-sectional view taken along lines I-I' and II-II' of FIG. 2.
Figure 3B:
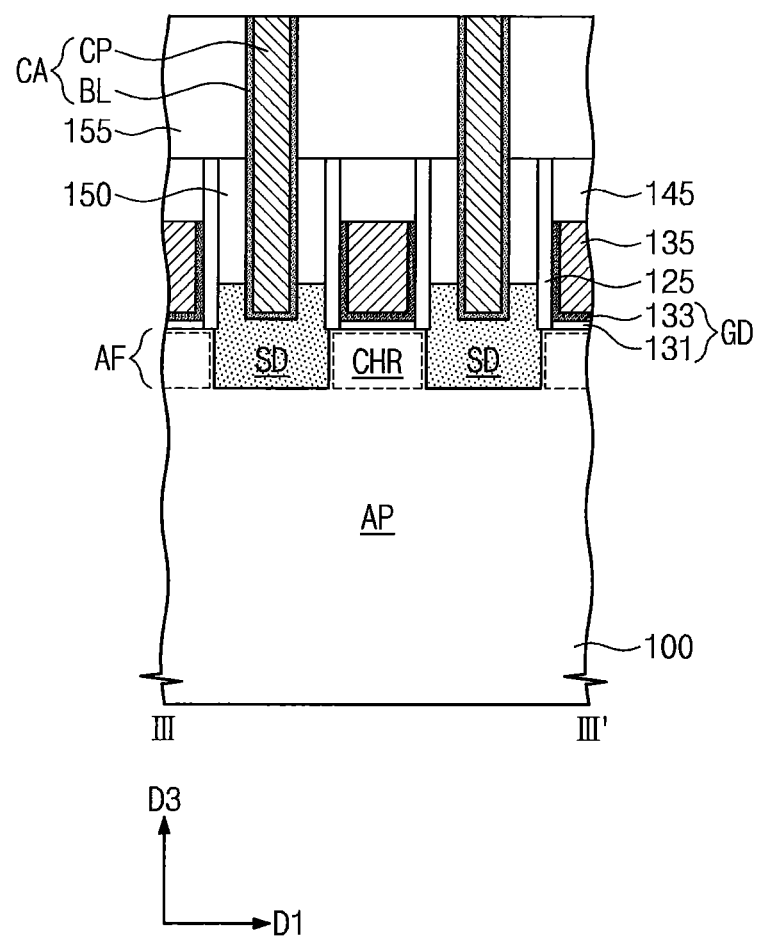
FIG. 3B is a cross-sectional view taken along line III-III' of FIG. 2.

FIG. 2 is a plan view illustrating a semiconductor device according to example embodiments. For example, FIG. 2 is an enlarged plan view of a portion, e.g., the first logic cell C1, of the semiconductor device in FIG. 1. FIG. 3A is a cross-sectional view taken along lines I-I' and II-II' of FIG. 2. FIG. 3B is a cross-sectional view taken along line III-III' of FIG. 2. Hereinafter, example embodiments will be described with reference to the first logic cell C1 of FIG. 1, but other logic cells may be substantially the same as or similar to the first logic cell C1.

Referring to FIGS. 2, 3A and 3B, device isolation layers 104 may be provided in a substrate 100 to define a PMOSFET region PR and a NMOSFET region NR. The device isolation layers 104 may be formed in an upper portion of the substrate 100. As an example, the device isolation layers 104 may include an insulation material, such as silicon oxide.

The PMOSFET and NMOSFET regions PR and NR may be spaced apart from each other in a second direction D2 that is perpendicular to the first direction D1 in a plane parallel to a top surface of the substrate 100 with the device isolation layers 104 interposed therebetween. In an example embodiment, although each of the PMOSFET and NMOSFET regions PR and NR may be shown as a single continuous region in drawings, it may be formed to include a plurality of regions which are separated from each other by the device isolation layers 104.

A plurality of active patterns AP extending in the first direction D1 may be provided on the PMOSFET and NMOSFET regions PR and NR. The active patterns AP may be arranged, e.g., spaced apart from each other, along the second direction D2. The active patterns AP may have a first conductivity type. The device isolation layers 104 may be disposed at both sides of each of the active patterns AP to define the active patterns AP. Although the number of the active patterns AP provided respectively on the PMOSFET and NMOSFET regions PR and NR in FIG. 2 is three, example embodiments are not limited thereto.

The active patterns AP may include active fins AF protruding respectively between the device isolation layers 104. More specifically, each of the active fins AF may protrude from the active pattern AP in a third direction D3 that is perpendicular to a top surface of the substrate 100. Each of the active fins AF may include source/drain regions SD and a channel region CHR interposed between the source/drain regions SD.

Gate structures may be disposed on the substrate 100. Each of the gate structures may include a gate electrode 135, a gate spacer 125, a gate dielectric layer GD and a gate capping layer 145.

The gate electrodes 135 may be disposed on the substrate 100 to cross the active patterns AP. The gate electrodes 135 may vertically overlap each of the channel regions CHR of the active fins AF. That is, each of the gate electrodes 135 may be shaped like a line which extends in the second direction D2 and crosses the active fins AF protruding between the device isolation layers 104.

The gate spacers 125 may be disposed on opposing sidewalls of each of the gate electrodes 135. The gate spacers 125 may extend in the second direction D2 along the gate electrodes 135. A top surface of each of the gate spacers 125 may be positioned at a higher level from the substrate 100 than a top surface of each of the gate electrodes 135. Furthermore, the top surface of each of the gate spacers 125 may be substantially coplanar with a top surface of a first interlayer insulation layer 150 which is described in more detail below. The gate spacers 125 may include at least one of $SiO_2$, SiCN, SiCON and SiN. In other example, each of the gate spacers 125 may include a multi-layer structure including at least one of $SiO_2$, SiCN, SiCON and SiN.

The gate dielectric layers GD may be respectively disposed between the gate electrodes 135 and the substrate 100, and between the gate electrodes 135 and the gate spacers 125. Each of the gate dielectric layers GD may extend along a bottom surface of the gate electrode 135. Accordingly, the gate dielectric layers GD may cover top surfaces and sidewalls of the channel regions CHR. The gate dielectric layers GD, which extend horizontally from the active fins AF, may partially cover top surfaces of the device isolation layers 104 opposite the substrate 100. In some embodiments, the top surfaces of the device isolation layers 104 may have portions that are not covered by the gate dielectric layers GD. The portions of the top surfaces of the device isolation layers 104 that are not covered by the gate dielectric layers GD may be covered by a interlayer insulation layer 150 described in more detail below.

Each of the gate dielectric layers GD may include an interfacial layer 131 that directly contacts the channel region CHR and a high-k dielectric layer 133 that covers the interfacial layer 131. That is, the interfacial layer 131 may be interposed between the active fin AF and the high-k dielectric layer 133. The interfacial layer 131 may be provided to stabilize interfacial properties at the boundary between the high-k dielectric layer 133 and the active fin AF.

The interfacial layer 131 may include, for example, at least one of silicon oxide and silicon oxynitride. The high-k dielectric layer 133 may include a high-k dielectric material. As an example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate.

The gate capping layers 145 may be disposed on the gate electrodes 135. The gate capping layers 145 may extend in the second direction D2 along the gate electrodes 135. The gate capping layers 145 may include material having an etch selectivity with respect to first and second interlayer insulation layers 150 and 155 which are described in more detail below. More specifically, the gate capping layers 145 may include at least one of SiON, SiCN, SiCON and SiN.

The source/drain regions SD may be provided in portions of the active fins AF positioned at opposing sides of each of the gate structures. The source/drain regions SD may include epitaxial patterns which are epitaxially grown from the active patterns AP. In some example embodiments, top surfaces of the channel regions CHR may be positioned at a higher level from the substrate 100 than bottom surfaces of the source/drain regions SD. In some example embodiments, top surfaces of the source/drain regions SD may be positioned at the same level or higher than the top surfaces of the channel regions CHR.

The source/drain regions SD may include semiconductor elements that are different from the substrate 100. For example, the source/drain regions SD may include semiconductor element whose lattice constant is greater or smaller than the lattice constant of the substrate 100. In this case, compressive stress or tensile stress may be created in the channel region CHR because the source/drain regions SD include the semiconductor element different from the substrate 100. As an example, when the substrate 100 is a silicon substrate, the source/drain regions SD may include silicon-germanium (SiGe) or germanium (Ge). In this case, compressive stress may be created in the channel region CHR, and a field effect transistor with the source/drain regions SD may preferably be a PMOSFET. For other example, when the substrate 100 is a silicon substrate, the source/drain regions SD may include silicon carbide (SiC). In this case, the tensile stress may be created in the channel regions CHR, and a field effect transistor with the source/drain regions SD may preferably be an NMOSFET. The mobility of charge carriers in the channel regions CHR may be improved by introducing the compressive or tensile stress in the channel regions when field effect transistor is operated. The source/drain regions SD may have a second conductivity type that is different from the conductivity type of the active pattern AP.

A first interlayer insulation layer 150 may be disposed on the substrate 100. The first interlayer insulation layer 150 may cover sidewalls of the gate structures and the source/drain regions SD. A top surface of the first interlayer insulation layer 150 may be substantially coplanar with top surfaces of the gate structures. A second interlayer insulation layer 155 covering the gate structures may be disposed on the first interlayer insulation layer 150.

Contacts CA may be disposed on opposite sides of the gate electrodes 135 through the first and second interlayer insulation layers 150 and 155, and may be electrically connected to the source/drain regions SD. One contact CA may be connected to one source/drain region SD, or may be simultaneously connected to a plurality of source/drain regions SD, but the inventive concepts are not limited thereto. Each of the contacts CA may include a conductive pillar CP and a contact barrier layer BL surrounding the conductive pillar CP. More specifically, the contact barrier layer BL may cover sidewalls and a bottom surface of the conductive pillar CP. The conductive pillar CP may include a metal, such as tungsten. The contact barrier layer BL may include a metal and/or a metal nitride, such as titanium and/or titanium nitride. Although not shown in the drawings, silicide layers may be respectively interposed between the source/drain regions SD and the contacts CA. That is, the contacts CA may be electrically connected to the source/drain regions SD through the silicide layers. The silicide layers may include a metal-silicide, such as titanium silicide, tantalum silicide and/or tungsten silicide.

Referring to FIG. 2, a gate contact CB and a conductive line CBL may be provided on the gate electrode 135. A first via V1 may be disposed between the gate contact CB and the conductive line CBL. The conductive line CBL may be electrically connected to the gate electrode 135 through the first via V1 and the gate contact CB, and may apply a signal to the gate electrode 135.

The first logic cell C1 may include a first wiring line PW1 provided outside the PMOSFET region PR and a second wiring line PW2 provided outside the NMOSFET region NR. As an example, the first wiring line PW1 on the PMOSFET region PR may serve as a pathway for delivering a drain voltage (Vdd) or a power voltage to the semiconductor device. As an example, the second wiring line PW2 on the NMOSFET region NR may serve as a pathway for delivering a source voltage (Vss) or a ground voltage to the semiconductor device.

Referring again to FIGS. 1 and 2, the first and second wiring lines PW1 and PW2 may extend parallel to the first direction D1, and may be shared by the logic cells adjacent each other in the second direction D2. As an example, the first wiring line PW1 may be shared by the first logic cell C1 and the third logic cell C3. Furthermore, the first wiring line PW1 may be shared by the PMOSFET regions PR, which are respectively provided in the first and second logic cells C1 and C2.

In some embodiments, a second via V2 may be provided on one of the contacts CA. Accordingly, the source/drain region SD may be electrically connected to the first wiring line PW1 through the one of the contacts CA and the second via V2. Similarly, the source/drain region SD on the NMOS- FET region may be electrically to the second wiring line PW2 through the one of the contacts CA and the third via V3.

Figure 4A:
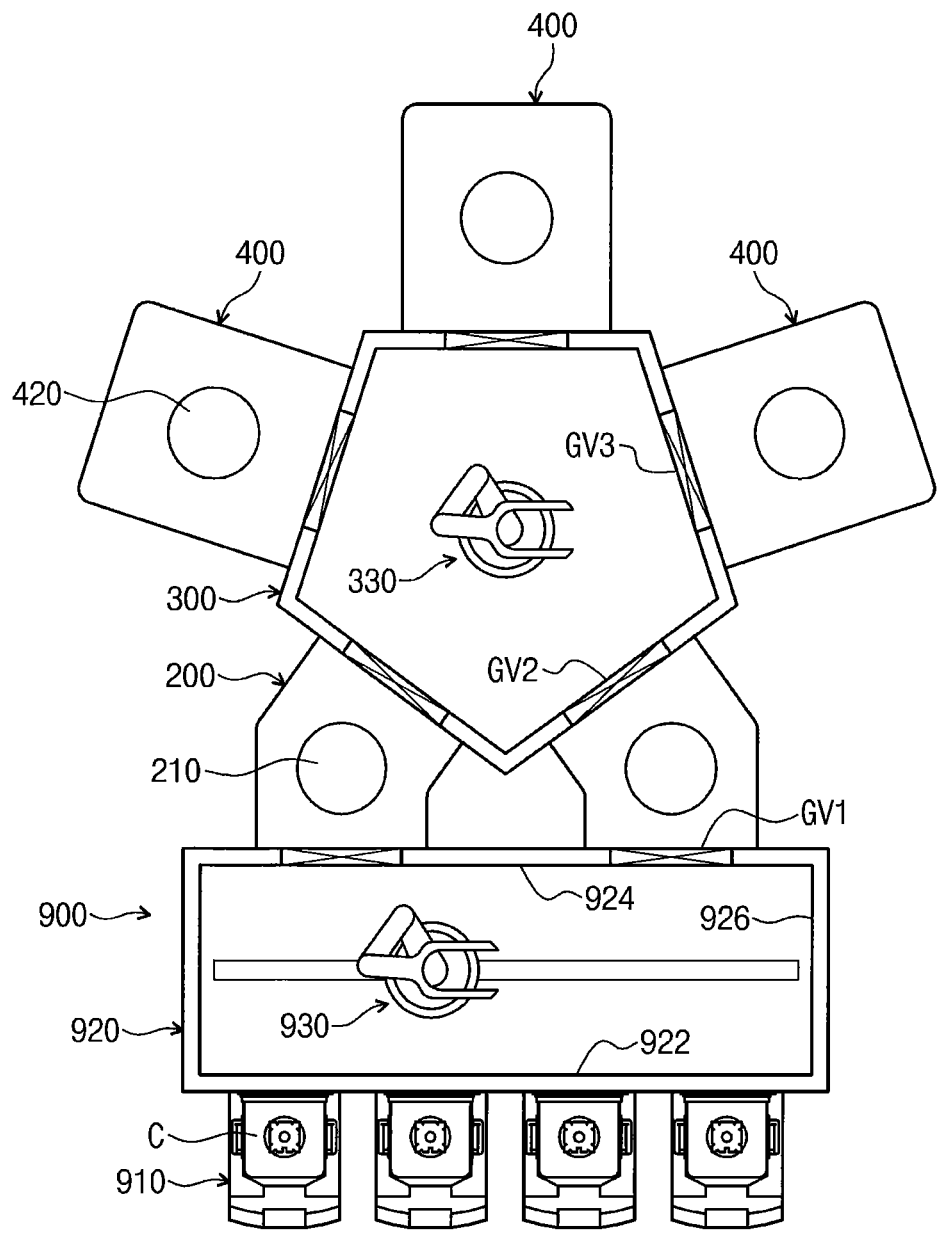
FIGS. 4A and 4B are plan and side views of a cluster apparatus for heat-treating a substrate in a vacuum at a low temperature according to example embodiments.
Figure 4B:
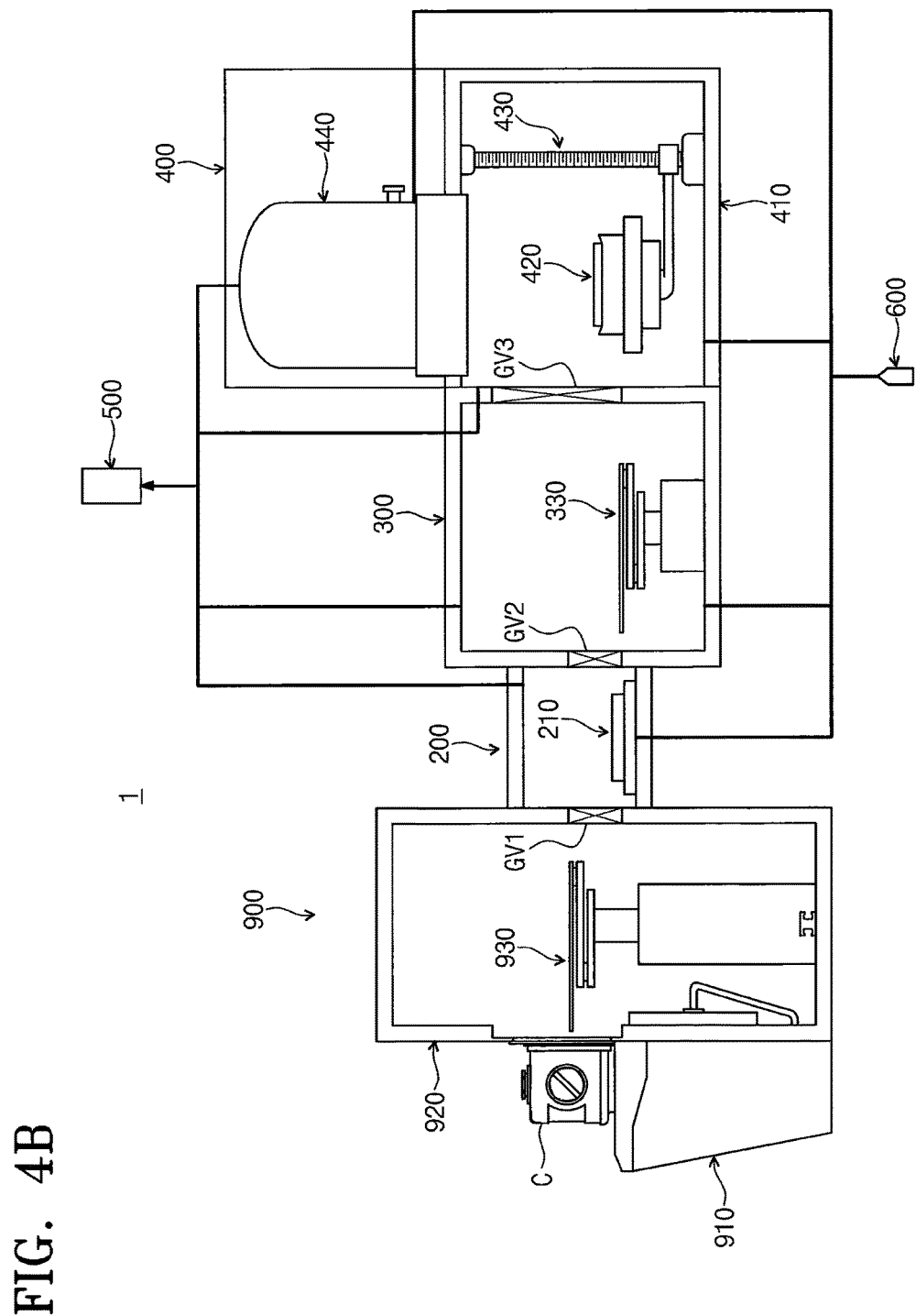

FIGS. 4A and 4B are plan and side views of a cluster apparatus for heat-treating a substrate in a vacuum at a low temperature according to some embodiments.

Referring to FIGS. 4A and 4B, a cluster apparatus may include an equipment front end module 900, first load lock chambers 200, a transfer chamber 300 and a process treating module 400. The terms "vacuum" or "vacuum pressure" used for describing the present embodiments will refer to any pressure below one atmosphere.

The equipment front end module (EFEM) 900 may be arranged in front of the cluster apparatus 1. The equipment front end module 900 may include load ports 910 for loading and unloading each of cassettes C, and an index chamber 920 having a first substrate transfer robot 930 positioned therein. The first substrate transfer robot 930 may transfer a substrate between the cassettes C and the first load lock chambers 200. For example, the first substrate transfer robot 930 may withdraw a substrate from one of the cassettes C, and may load the substrate into one of the load lock chambers 200. The first substrate transfer robot 930 may be used at an atmospheric pressure.

The index chamber 920 may be arranged between the load ports 910 and the first load lock chamber 200. When viewed in a plan view, the index chamber 920 may be in the form of a rectangular parallelepiped. The index chamber 920 may include a front panel 922, a rear panel 924 and both side panels 926. The first substrate transfer robot 930 may move horizontally in the index chamber 920. Although not shown in the drawings, the index chamber 920 may include a controlled air flow system including vents and a laminar flow system for reducing/preventing particle contaminants from entering inside.

Passages for transporting the substrate in the first load lock chambers 200 may be disposed on the rear panel 924 in contact with the first load lock chambers 200. The passages may be opened and closed respectively by a first gate valve GV1.

The load ports 910 may be arranged in a line on the front panel 922. The cassette C may be a front open unified pod (FOUP) which is a cassette-integrated vessel with an open front side and an open/close door.

The first load lock chamber 200 may be arranged between the equipment front end module 900 and the transfer chamber 300. For example, two first load lock chambers 200 may be provided between the equipment front end module 900 and the transfer chamber 300. An internal space of the first load lock chamber 200 may optionally be converted to atmospheric or vacuum pressure. The first load lock chamber 200 may include a first mounting unit 210 in which the substrate is loaded.

The transfer chamber 300 may be connected to the first load lock chamber 200 through a second gate valve GV2. The transfer chamber 300 may be arranged between the first load lock chamber 200 and the process treating module 400. When viewed in a plan view, the transfer chamber 300 may have a shape of a polygon. The transfer chamber 300 may include a second substrate transfer robot 330 positioned therein. The second substrate transfer robot 330 may transfer a substrate between the first load lock chambers 200 and the process treating module 400. The second substrate transfer robot 330 may be a vacuum robot that transfers the substrate in a vacuum environment.

Referring back to FIG. 4B, a plurality of the process treating modules 400 may be connected to the transfer chamber 300 through third gate valves GV3. For example, the transfer chamber 300 may be connected to the three the process treating modules 400 for performing a low-temperature heat treatment, and the number may be changed in various ways depending on the required conditions. Each of the process treating modules 400 may include a second load lock chamber 410 and a process chamber 440. The second load lock chamber 410 may include a second mounting unit 420 in which the substrate transported from the transfer chamber 300 is loaded. An elevator unit 430 may be disposed in the second load lock chamber 410. The elevator unit 430 may load/unload the second mounting unit 420 into/from an internal space of the process chamber 440.

The cluster apparatus 1 may include a vacuum vent unit 500 and an inert gas supply unit 600. The vacuum vent unit 500 may be connected to each of the first load lock chamber 200, the transfer chamber 300, the second load lock chamber 410 and the process chamber 440, and may create a vacuum inside the chambers 200, 300, 410 and 440.

The inert gas supply unit 600 may be connected to each of the first load lock chamber 200, the transfer chamber 300, the second load lock chamber 410 and the process chamber 440, and may supply an inert gas to the chambers 200, 300, 410 and 440. The inert gas may suppress chemical reactions on the substrate during performance of a heat treatment in the process chamber 440. The inert gas may include at least one of, for example, helium (He), neon (Ne), argon (Ar), krypton (Kr), Xenon (Xe) and radon (Rn).

As previously described, the first, second and third valves GV1, GV2 and GV3 may be disposed between the index chamber 920 and the first load lock chamber 200, between the first load lock chamber 200 and the transfer chamber 300 and between the transfer chamber 300 and the second load lock chamber 410, respectively. Accordingly, the cluster apparatus 1 may independently control a pressure in each of the chambers.

Figure 10A:
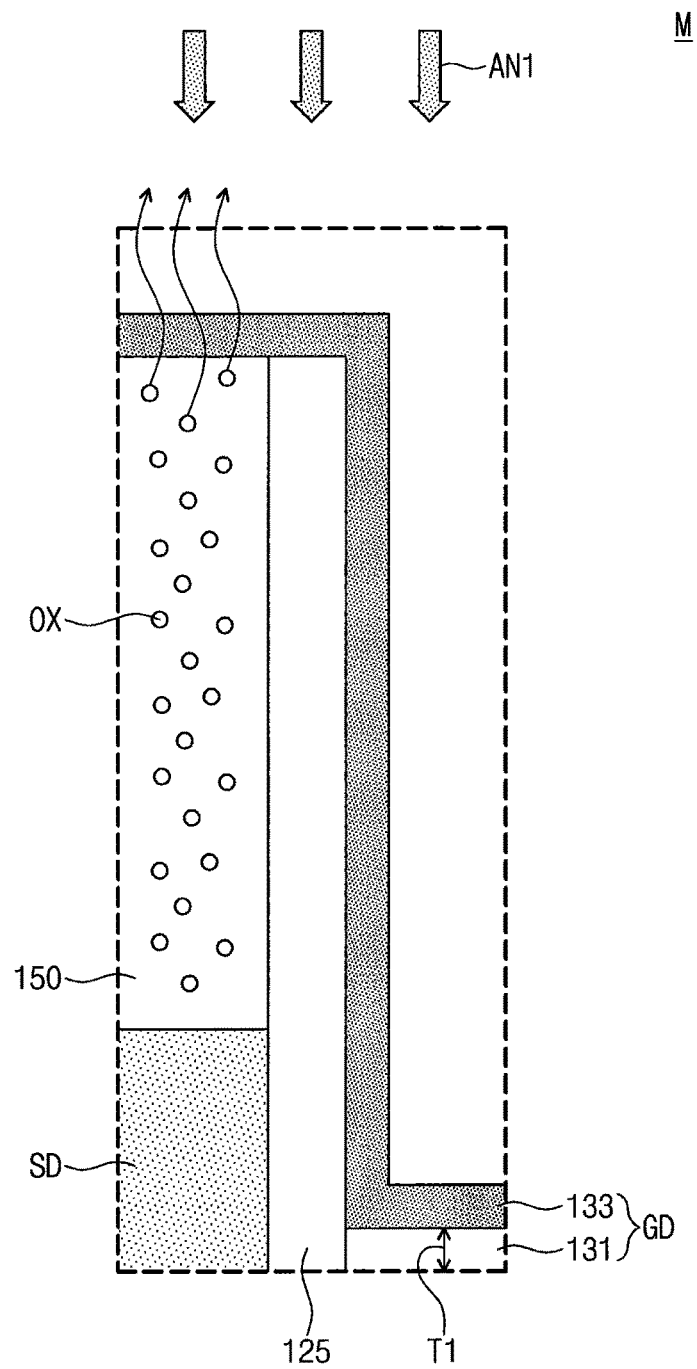
FIGS. 10A and 10B are enlarged drawings of M region shown in FIG. 9B, which are illustrated to provide a description of first and second heat treatments AN1 and AN2 according to example embodiments.
Figure 10B:
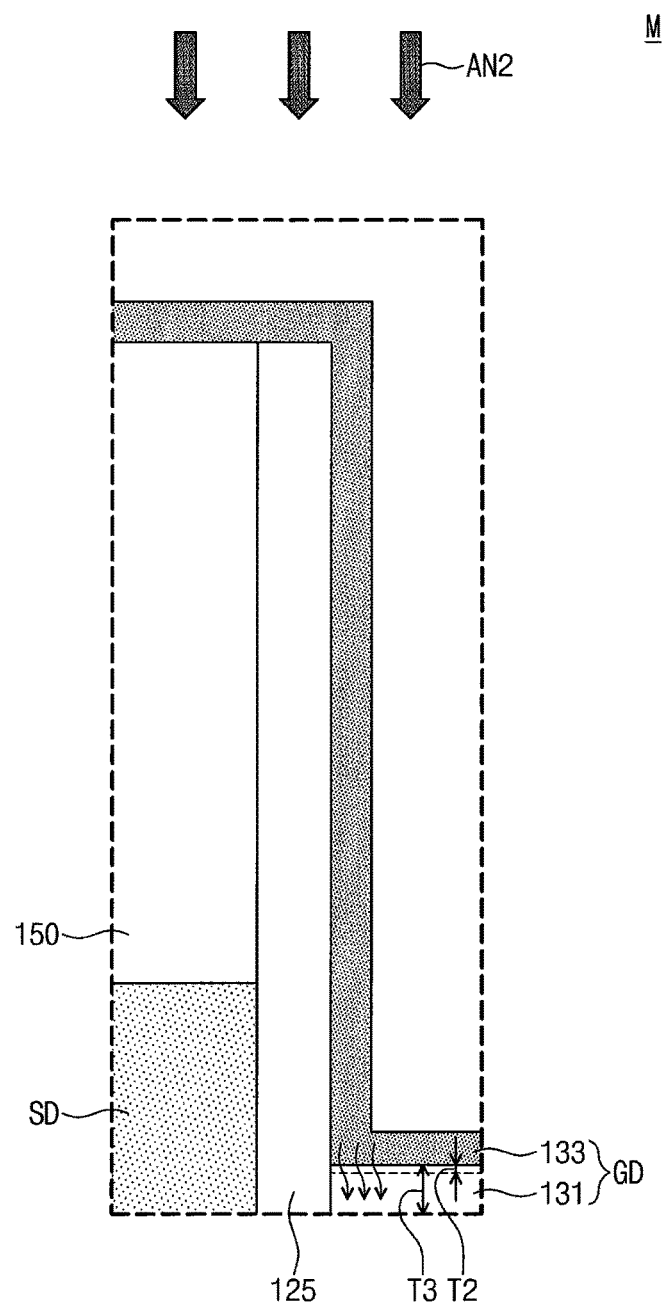
Figure 11:
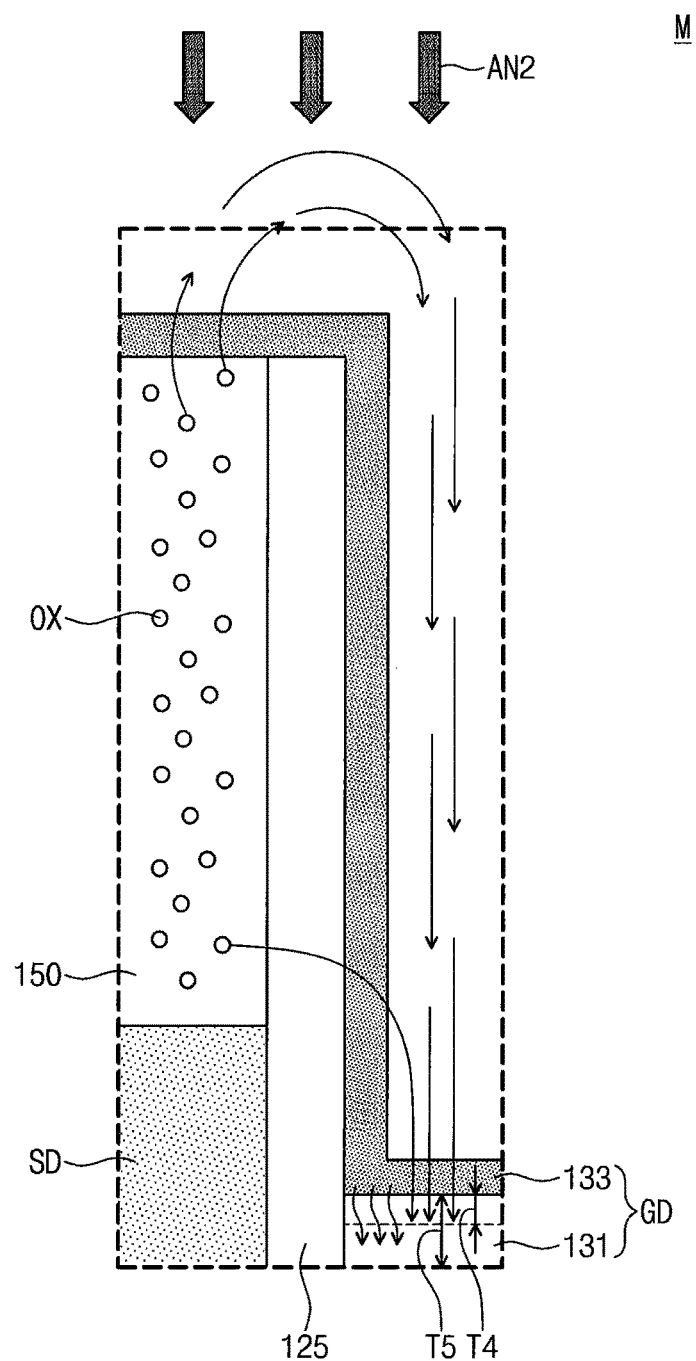
FIG. 11 is an enlarged drawing of M region shown in FIG. 9B, which is illustrated to provide a description of a second heat treatment AN2 according to other embodiments.

FIGS. 5A to 9A, 12A, and 13A are cross-sectional views taken along line I-I' of FIG. 2, which illustrate methods of manufacturing a semiconductor device according to some embodiments. FIGS. 5B to 9B, 12B, and 13B are cross-sectional views taken along line II-IF of FIG. 2, which illustrate methods of manufacturing a semiconductor device according to some embodiments. FIGS. 10A and 10B are enlarged drawings of M region shown in FIG. 9B, which illustrate first and second heat treatments AN1 and AN2 according to some embodiments. FIG. 11 is an enlarged drawing of M region shown in FIG. 9B, which illustrates a second heat treatment AN2 according to other embodiments.

Figure 5A:
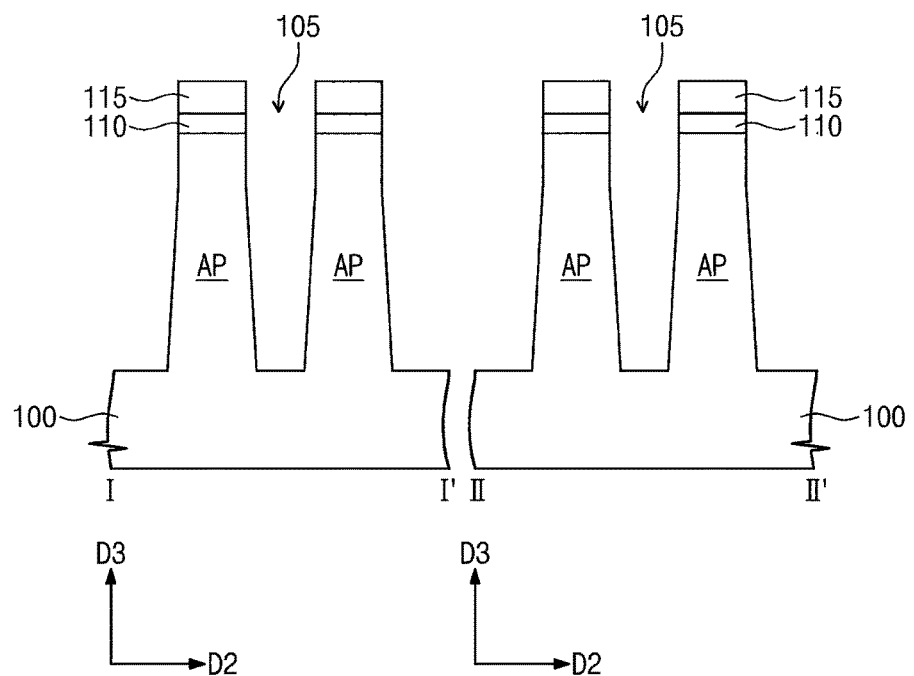
Figure 5B:
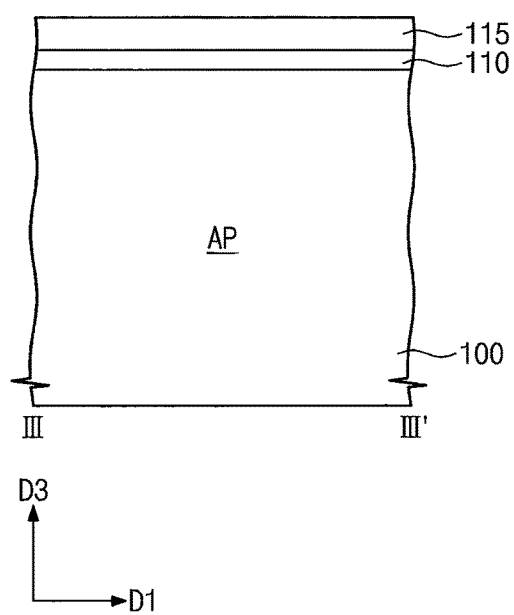

Referring to FIGS. 2, 5A, and 5B, device isolation trenches 105 may be formed on a substrate 100 to define active patterns AP. The substrate 100 may include a silicon substrate, a germanium substrate, a silicon-germanium substrate or a compound semiconductor substrate. The active patterns AP may be doped with a first conductivity type dopant.

The device isolation trenches 105 may be formed by forming mask patterns on the substrate 100 and anisotropically etching the substrate 100 using the mask patterns as an etch-mask. The mask patterns may include a first mask pattern 110 and a second mask pattern 115 which are sequentially stacked on the substrate and have a etch selectivity with respect to each other. Each of the device isolation trenches 105 may be formed to have aspect ratio of at least about 5. The width of each of the device isolation trenches 105 may decrease with depth. Accordingly, a width of each of the active patterns AP may increase with depth, so that each of the active patterns may become more narrow toward the surface of the substrate 100.

Figure 6A:
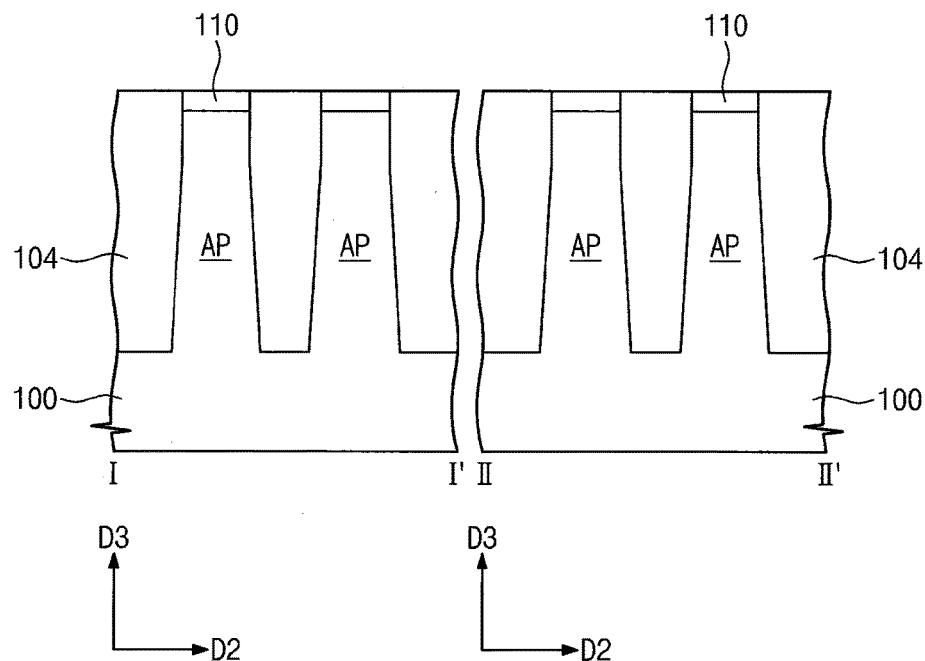
Figure 6B:
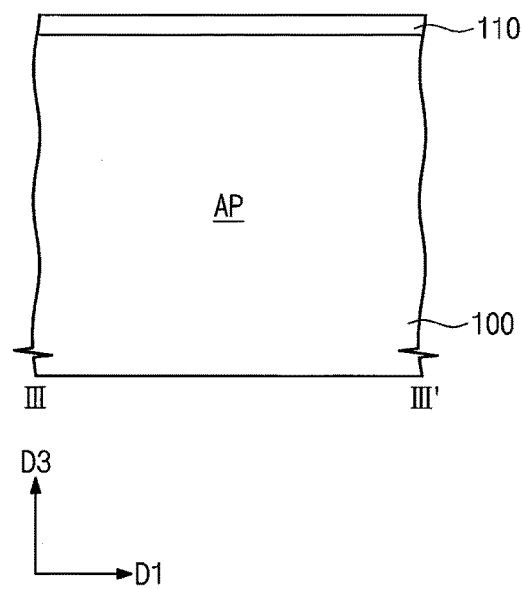

Referring to FIGS. 2, 6A, and 6B, device isolation layers 104 may be formed to fill the device isolation trenches 105. The device isolation layer 104 may be formed by filling the device isolation trench 105 with an insulating material (e.g., silicon oxide) and planarizing the insulating layer until a top surface of the first mask pattern 110 is exposed. Thus, the device isolation layers 104 may be locally formed in the device isolation trenches 105.

Figure 7A:
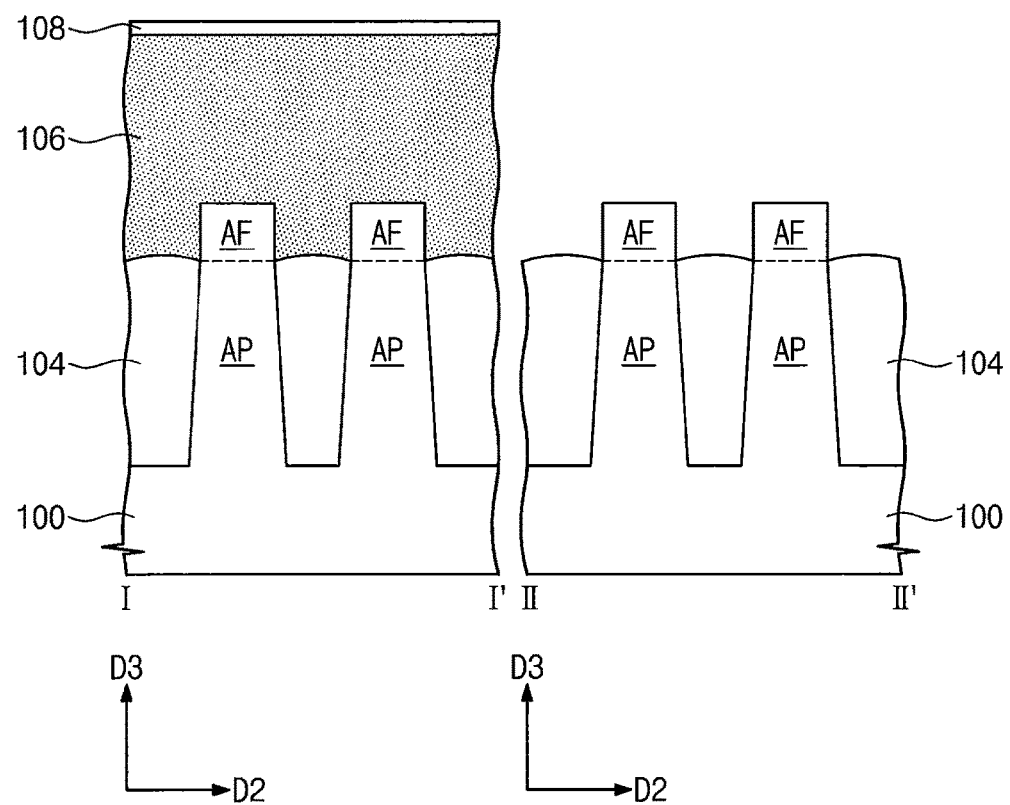
Figure 7B:
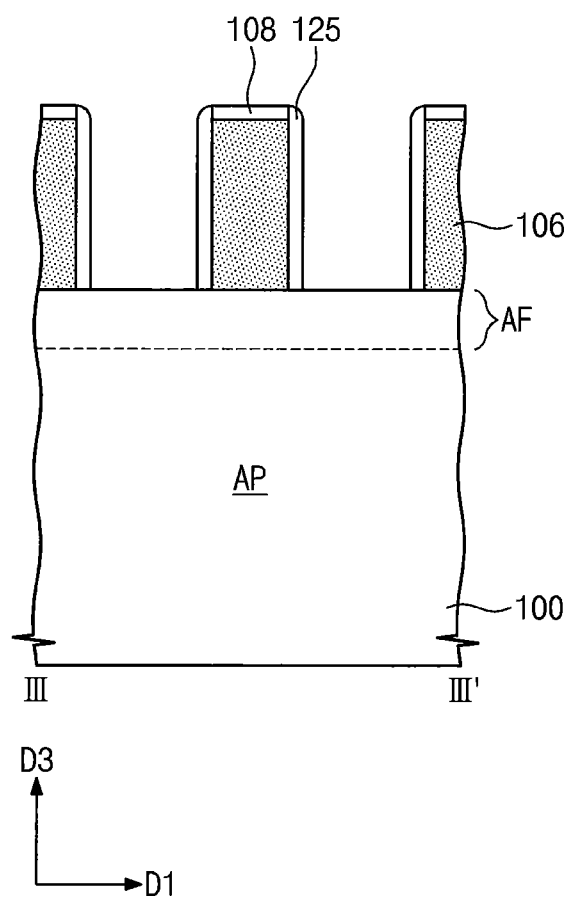

Referring to FIGS. 2, 7A, and 7B, upper regions (hereinafter, it is referred as an active fin AF) of the active patterns AP may be exposed. The active fin AF may be exposed, for example, by recessing an upper portion of the device isolation layer 104 using a wet etching process. The device isolation layers 104 may be etched using an etching recipe having an etching selectivity with respect to the active patterns AP. The first mask pattern 110 may be removed when the device isolation layers 104 are etched. Accordingly, top surfaces of the active fin AF may be exposed.

Sacrificial gate patterns 106 and gate mask patterns 108 may be sequentially formed on the active fins AF. Each of the sacrificial gate patterns 106 and gate mask patterns 108 may be formed in a line shape or a bar shape extending in a first direction D1, and may cross the active fins AF. For example, the sacrificial gate patterns 106 and gate mask patterns 108 may be formed by patterning the sacrificial gate layer (not shown) and gate mask layer (not shown) which are formed sequentially on the active fins AF and the device isolation layers 104. The sacrificial gate layer may include a polycrystalline silicon layer. The gate mask layer may include a silicon nitride layer or a silicon oxynitride layer.

Gate spacers 125 may be formed on opposite sidewalls of each of the sacrificial gate patterns 106. The gate spacers 125 may be formed by conformally forming a spacer layer covering the sacrificial gate pattern 106 on the substrate 100 and anisotropically etching the spacer layer. The spacer layer may be formed using at least one of silicon oxide ($SiO_2$), silicon carbide nitride (SiCN), silicon carbide oxynitride (SiCON) and silicon nitride (SiN). As another example, the spacer layer may be formed in a multi-layer including at least one of silicon oxide ($SiO_2$), silicon carbide nitride (SiCN), silicon carbide oxynitride (SiCON) and silicon nitride (SiN).

Figure 8A:
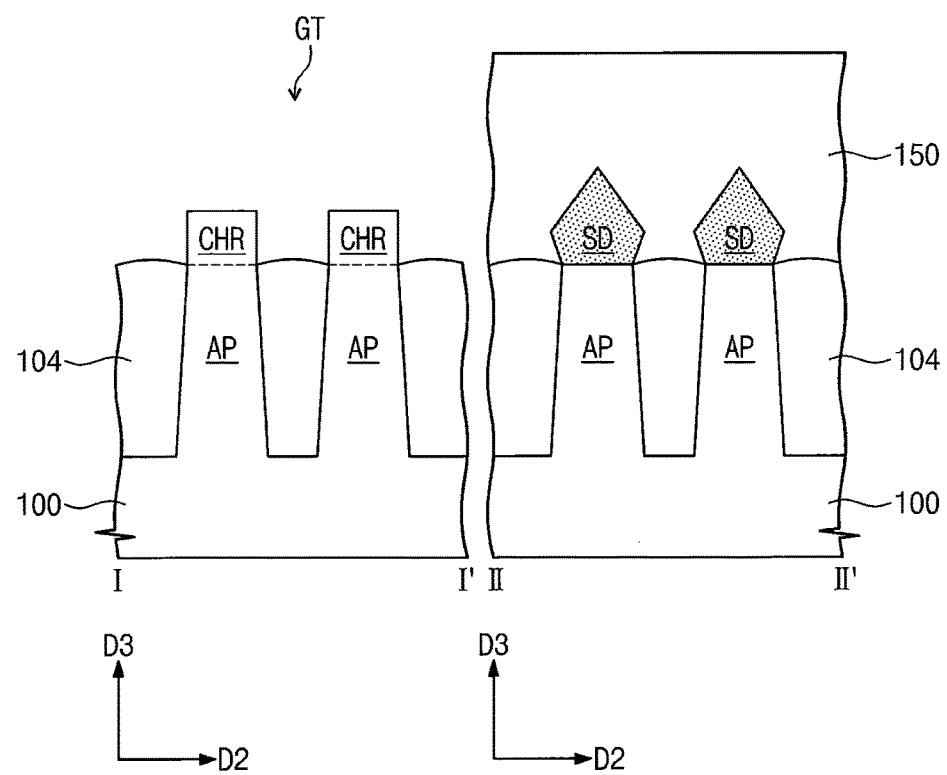
Figure 8B:
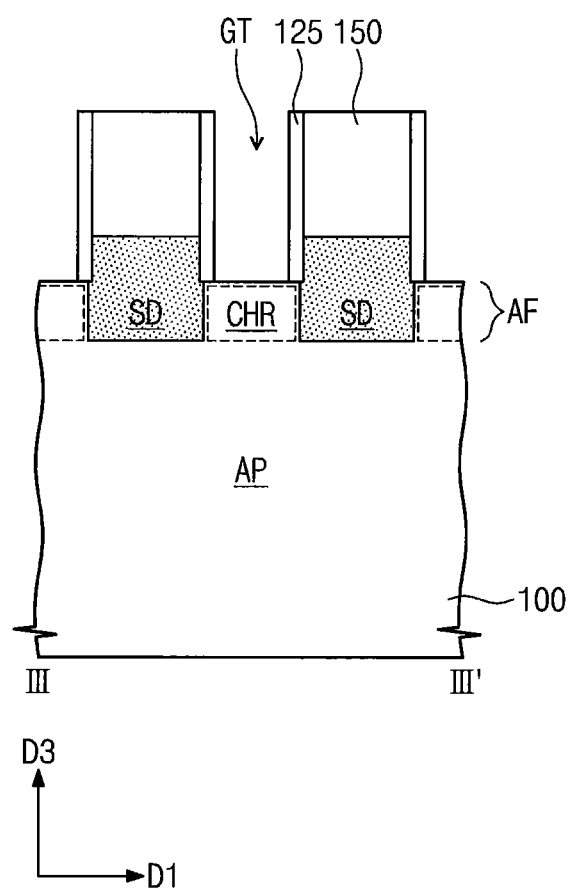

Referring to FIGS. 2, 8A, and 8B, source/drain regions SD may be formed on opposite sides of each of the sacrificial gate patterns 106. For example, the source/drain regions SD may be formed by a selective epitaxial growth process using the substrate 100 as a seed layer. As an example, the selective epitaxial growth process may include a chemical vapor deposition process or a molecular beam epitaxy process. To from the source/drain regions SD, the active fins AF may be selectively etched using the gate mask patterns 108 and the gate spacers 125 as an etch-mask. After the active fins AF have been etched, the source/drain regions SD may be formed using the exposed active pattern AP as a seed layer. Channel regions CHR may be defined between the source/drain regions SD by forming the source/drain regions SD.

Top surfaces of the source/drain regions SD may be positioned at a higher level from the substrate 100 than the top surface of the channel region CHR. In addition, the top surfaces of the source/drain regions SD may have a non-zero curvature. For example, the source/drain regions SD may be convex upward.

The source/drain regions SD may include a semiconductor element that is different from that of the substrate 100. For example, the source/drain regions SD may include a semiconductor element whose lattice constant is greater or smaller than that of substrate 100. In this case, compressive stress or tensile stress may be created in the channel regions CHR because the source/drain regions SD include the semiconductor element that is different from that of the substrate 100. For example, when the substrate 100 is a silicon substrate, the source/drain regions SD may include silicon germanium (SiGe) or germanium (Ge). In this case, a compressive stress may be created in the channel region CHR and a field effect transistor with the source/drain regions SD may preferably be a PMOSFET. In other embodiments, when the substrate 100 is a silicon substrate, the source/drain regions SD may include silicon carbide (SiC). In this case, a tensile stress may be created in the channel region CHR and a field effect transistor with the source/drain regions SD may be an NMOSFET. The mobility of carriers in the channel region may be improved by introducing the compressive or tensile stress in the channel region when the field effect transistor is operated.

The source/drain regions SD may be doped with a second conductivity type dopant that is different from the first conductivity type of the active patterns AP. In some embodiments, the second conductivity type dopants may be in-situ doped when the source/drain regions SD are formed. In other embodiments, after forming the source/drain regions SD, the second conductivity type dopants may be implanted into the source/drain regions SD.

A first interlayer insulating layer 150 may be formed on the source/drain regions SD. The first interlayer insulating layer 150 may be formed on the entire region of the substrate 100 to cover the sacrificial gate patterns 106 and the gate mask patterns 108. For example, the first interlayer insulating layer 150 may include a silicon oxide layer and may be formed by a flowable chemical vapor deposition (FCVD) process.

The first interlayer insulating layer 150 may be planarized until top surfaces of the sacrificial gate patterns 106 are exposed. Planarization of the first interlayer insulating layer 150 may be performed using an etch-back or CMP (chemical mechanical polishing) process. The gate mask patterns 108 may be removed by the planarization process, and then the top surfaces of the sacrificial gate patterns 106 may be exposed. Upper portions of the gate spacers 125 may be removed by the planarization process. Accordingly, the top surface of the first interlayer insulating layer 150 may be coplanar with the top surfaces of the sacrificial gate patterns 106 and top surfaces of the gate spacers 125.

The sacrificial gate patterns 106 may be removed to form gate trenches GT. The gate trenches GT may be formed by using an etching process which selectively removes the sacrificial gate patterns 106. The channel regions CHR of the active fins AF may be exposed by the gate trenches GT.

Figure 9A:
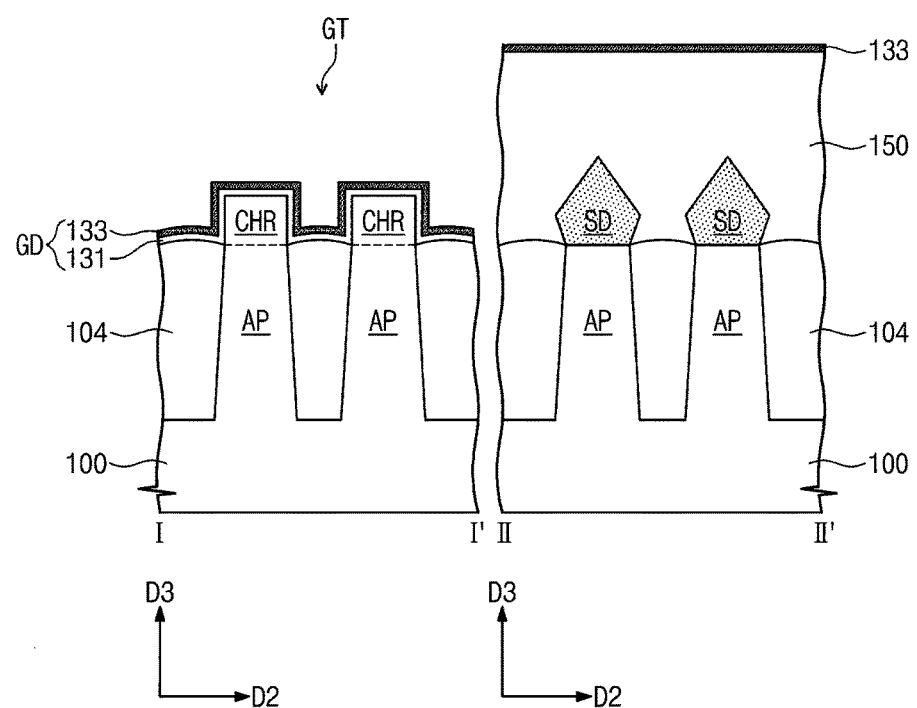
Figure 9B:
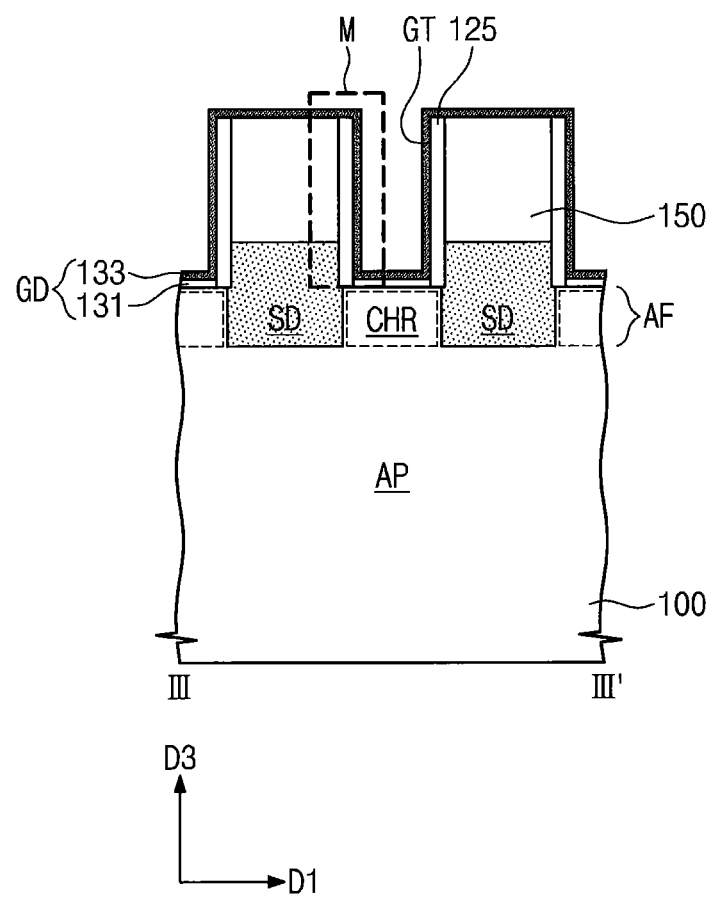

Referring to FIGS. 2, 9A, and 9B, a gate dielectric layer GD may be formed to partially fill the gate trenches GT. The gate dielectric layer GD may be formed by forming an interfacial layer 131 on the channel regions CHR of the active fins AF, and forming a high-k dielectric layer 133 on the interfacial layer 131. A high-k dielectric layer 133 may be formed as a conformal layer on the interfacial layer 131 in the gate trenches GT. The interfacial layer 131 may be grown from exposed surfaces of the channel regions CHR by performing an oxidation process using plasma on the channel regions CHR. That is, the interfacial layer 131 may be formed as a result of a thermal oxidation process and/or a chemical oxidation process performed on the exposed surfaces of the channel regions CHR. The oxidation process may use at least one of oxygen plasma, ozone plasma and water vapor plasma. The interfacial layer 131 may include at least one of silicon oxide (SiO$_2$) and silicon oxynitride (SiON). The interfacial layer may have a first thickness T1 (see FIG. 10A).

After forming the interfacial layer 131, the high-k dielectric layer 133 may be formed by using an atomic layer deposition (ALD). The high-k dielectric layer may include a high-k dielectric material. For example, the high-k dielectric material may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide and lead zinc niobate. The high-k dielectric layer 133 may entirely cover a top surface of the interfacial layer 131, sidewalls and top surfaces of the gate spacers 125, and a top surface of the first interlayer insulating layer 150.

Referring to FIGS. 4A, 4B, and 10A, a first heat treatment AN1 may be performed on the first interlayer insulating layer 150. The first heat treatment AN1 may be a heat treatment process that is performed in a vacuum at a low temperature, and may be performed, for example, using the cluster apparatus 1 illustrated in FIGS. 4A and 4B. It will be appreciated, however, that some embodiments do not require the use of the cluster apparatus 1, but can be performed using other types of processing equipment.

The substrate 100 may be loaded to a first load unit 210 of a first load lock chamber 200 through an equipment front end module 900. When the substrate 100 is loaded to the first load unit 210, an inside of the first load lock chamber 200 may be evacuated by a vacuum evacuation unit 500 and may be maintained in a vacuum. For example, a transfer chamber 300, second load lock chambers 410 and process chambers 440 may already be at substantially the same vacuum pressure. After loading the substrate 100 into the first load lock chamber 200, the first load lock chamber 200 may be controlled to be at substantially the same vacuum pressure as that of the transfer chamber 300, second load lock chamber 410 and process chamber 440.

The substrate 100 may be transferred to a process treating module 400 through the transfer chamber 300. The substrate 100 may be loaded into the process chamber 440 in a state being loaded on a second load unit 420. After loading the substrate 100, the first heat treatment AN1 may be performed in the process chamber 440. For example, the first heat treatment AN1 may be performed at a vacuum pressure ranging from 1 Torr to 40 Torr, and at a temperature ranging from 400° C. to 900° C. The first heat treatment AN1 may be performed for a time period of from 10 sec to 600 sec. When the first heat treatment AN1 is performed, an inert gas may be provided through an inert gas supply unit 600. Accordingly, a chemical reaction capable of occurring on the substrate 100 may be suppressed.

The first interlayer insulating layer 150 may be a porous silicon oxide layer. Accordingly, impurities OX may be formed in the first interlayer insulating layer 150 as a result of one or more of the processes, such as a cleaning process, a removing process of the sacrificial gate patterns 106, a forming process of the interfacial layer 131 and so on, which are performed after the first interlayer insulating layer 150 is formed. For example, the impurities OX may include at least one of oxygen (O$_2$) and water vapor (H$_2$O). The impurities OX within the first interlayer insulating layer 150 may be discharged to the outside of the first interlayer insulating layer 150 by the first heat treatment AN1 under conditions of low temperature and pressure. Accordingly, the impurities OX may be significantly removed from the first interlayer insulating layer 150.

If the first heat treatment AN1 is performed at a pressure of greater than about 40 Torr, the removal of the impurities OX may be difficult. In addition, if a temperature of the first heat treatment AN1 is lower than about 400° C., it may be difficult for sufficient energy to be transmitted to the substrate for releasing the impurities OX outside the interlayer insulating layer 150. However, if the temperature the first heat treatment AN1 is greater than about 900° C., the impurities OX may be diffused into the interfacial layer 131 by excessive diffusion.

Accordingly, due to the pressure, temperature and time of the first heat treatment, the first heat treatment specifically targets impurities OX in the interlayer insulating layer 150.

After finishing the first heat treatment AN1, the substrate 100 may be transferred from the process chamber 440 to the first load lock chamber 200. After releasing the vacuum in the first load lock chamber 200, the substrate 100 may be unloaded from the cluster apparatus 1.

Referring to FIG. 10B, a second heat treatment AN2 may be performed to target the high-k dielectric layer 133. The second heat treatment AN2 may be a heat treatment process in atmospheric pressure at high temperature. The second heat treatment AN2 may be performed using an atmosphere heat treatment apparatus different from the cluster apparatus 1 which is previously described in FIGS. 4A and 4B.

The atmosphere heat treatment apparatus may omit the first load lock chamber 200 and the transfer chamber 300 from the cluster apparatus 1. That is, because it is not necessary to control the vacuum pressure in the atmosphere heat treatment apparatus, the equipment front end module 900 may be directly connected to the process treating module 400. In some embodiments, after releasing the vacuum in the process chamber 440 in which the first heat treatment AN1 is performed, the second heat treatment AN2 may be subsequently performed in the process chamber 440.

The second heat treatment AN2 may be performed at an atmospheric pressure (1 atm) and at a temperature ranging from 700° C. to 1200° C. The second heat treatment AN2 may be performed for from 10 sec to 600 sec. A dielectric characteristic of the high-k dielectric layer 133 may be improved due to the second heat treatment AN2. Moreover, materials contained in the high-k dielectric layer 133 may be diffused into the interfacial layer 131 by the second heat treatment AN2. In more detail, if the high-k dielectric layer 133 is formed of hafnium oxide, hafnium components may be diffused into the interfacial layer 131 during heating the high-k dielectric layer 133 at a high temperature. That is, the high-k dielectric layer 133 and the interfacial layer 131 may be chemically mixed by the high temperature of the second heat treatment AN2.

The interfacial layer 131 may be additionally grown as much as a second thickness T2 while the second heat treatment AN2 is performed. For example, the second thickness T2 may be from 0.1 Å to 0.5 Å. Some of the impurities OX remaining in the first interlayer insulating layer 150 may be diffused into the interfacial layer 131, and thus the interfacial layer 131 may be further grown. Accordingly, the interfacial layer 131 may have a third thickness T3 that is greater than the first thickness T1. As a result, a thickness of the gate dielectric layer GD may be increased from 0.1 Å to 0.5 Å.

In some embodiments, the second heat treatment AN2 may be omitted. That is, the second heat treatment AN2 may be selectively performed.

FIG. 11 illustrates an example in which the first heat treatment AN1 is omitted and the second heat treatment AN2 is only performed. Referring to FIG. 11, the second heat treatment AN2 may be performed on the high-k dielectric layer 133 without the first heat treatment AN1. The apparatus and process conditions used to perform the second heat treatment AN2 may be the same as that described above with reference to FIG. 10B.

When the first heat treatment AN1 is omitted, the impurities OX may remain in the first interlayer insulating layer 150. During the second heat treatment AN2 at high temperature, a large amount of the impurities OX may be diffused into the interfacial layer 131. Accordingly, the interfacial layer 131 may be overgrown by the impurities OX. The interfacial layer 131 may be additionally grown as much as a fourth thickness T4. For example, the fourth thickness T4 may be from 0.5 Å to 1 Å. As a result, the interfacial layer 131 may have a fifth thickness T5.

When the interfacial layer 131 has an additional thickness corresponding to the fourth thickness T4, characteristics of the interfacial layer 131 may be degraded. This may cause a threshold voltage of a transistor to shift to much greater than a target value. Accordingly, semiconductor device reliability may be reduced. On the other hand, when the first heat treatment AN1 according to example embodiments is performed prior to performing the second heat treatment AN2, additional growth of the interfacial layer 131 may be significantly reduced (see FIGS. 10A and 10B). Accordingly, the threshold voltage of the transistor may be controlled to the target value, and the reliability of the semiconductor device may be improved.

On the other hand, the first heat treatment AN1 may be performed prior to performing the second heat treatment AN2. However, the order of the heat treatments using these two kinds of heat treatment conditions is not limited to this order. For example, the first heat treatment AN1 may be performed after forming the gate trenches GT and before forming the high-k dielectric layer 133. That is, those skilled in the art may appropriately change the order of performing the first heat treatment AN1 in accordance with the purpose thereof.

In experiment example 1, the first and second heat treatments AN1 and AN2 previously described with reference to FIGS. 10A and 10B were performed on a gate dielectric layer GD. The first heat treatment AN1 was performed at a pressure of about 1 Torr and at a temperature of about 430° C., and the second heat treatment AN2 was performed at a pressure of about 1 Torr and at a temperature of about 880° C. After finishing the first and second heat treatments AN1 and AN2, a regrown thickness of the interfacial layer 131 was measured (experiment example 1).

In experiment example 2, the second heat treatment AN2 previously described with reference to FIG. 11 was performed on the gate dielectric layer GD. In this case, the first heat treatment AN1 was omitted. The second heat treatment AN2 was performed at a pressure of about 1 atm and at a temperature of about 880° C. After finishing the second heat treatment AN2, a regrown thickness of the interfacial layer 131 was measured (experiment example 2). The results of the above experiment examples are shown in Table 1.

TABLE 1

|  | Experiment example 1 | Experiment example 2 |
| --- | --- | --- |
| Regrown thickness of interfacial layer | 0.18 Å | 0.5 Å |

As shown in Table 1, a regrowth of the interfacial layer 131 may be significantly reduced by adding the first heat treatment AN1 in a vacuum condition.

Figure 12A:
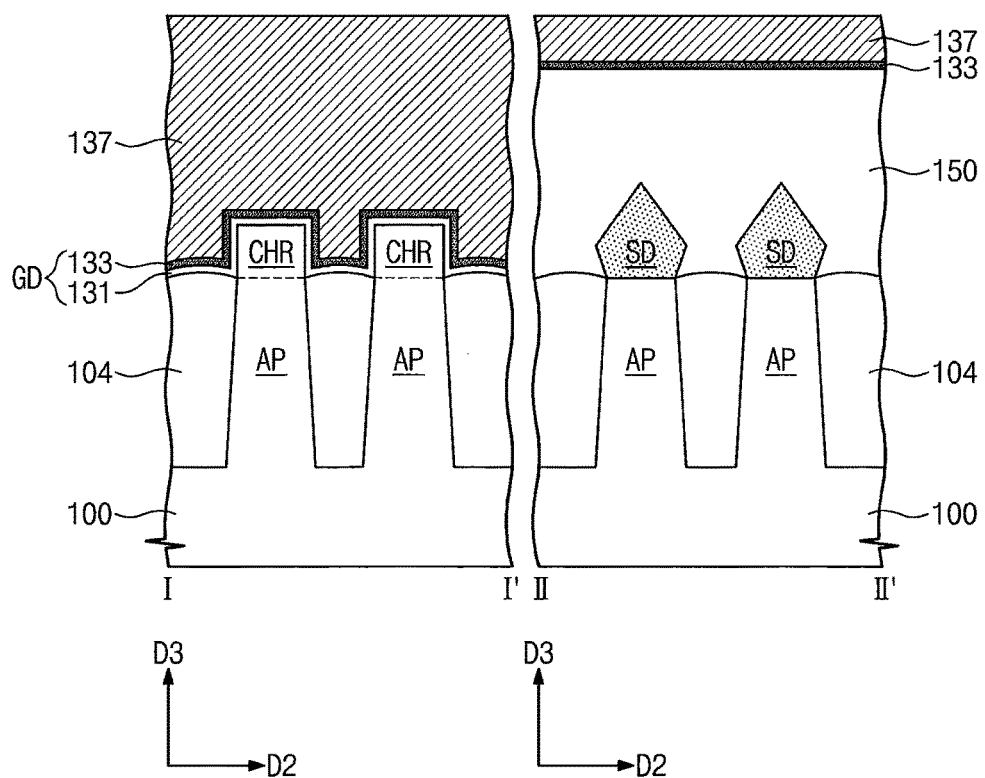
Figure 12B:
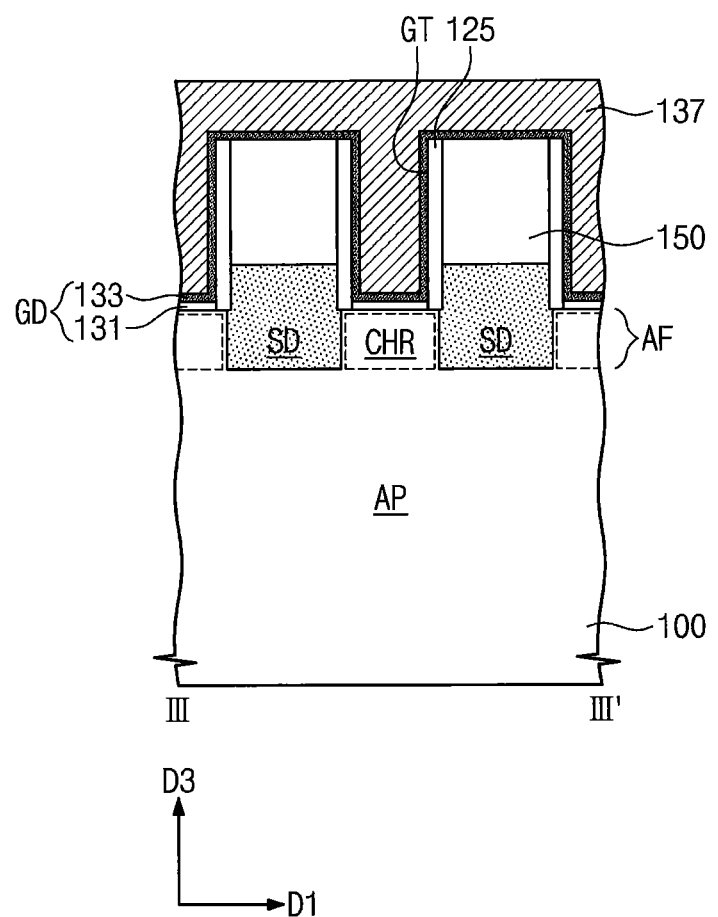

Referring to FIGS. 12A and 12B, a conductive layer 137 may be formed on the gate dielectric layer GD. The conductive layer 137 may the gate trenches GT. The conductive layer 137 may include at least one of conductive metal nitride (e.g., titanium nitride or tantalum nitride) and metal material (e.g., titanium, tantalum, tungsten, copper or aluminum). The conductive layer 137 may be formed by a deposition process, such as a CVD or sputtering process.

Figure 13A:
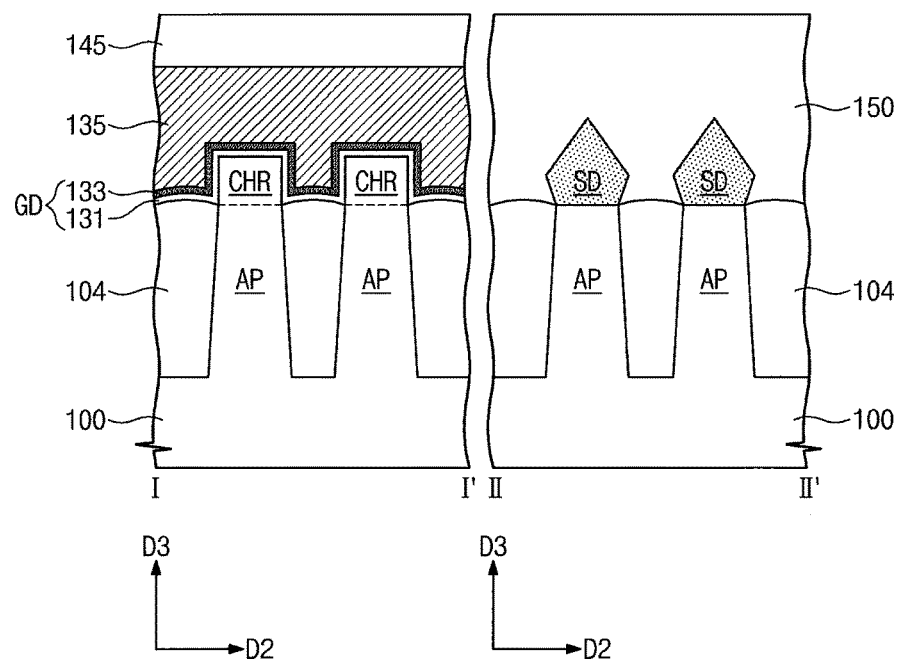
Figure 13B:
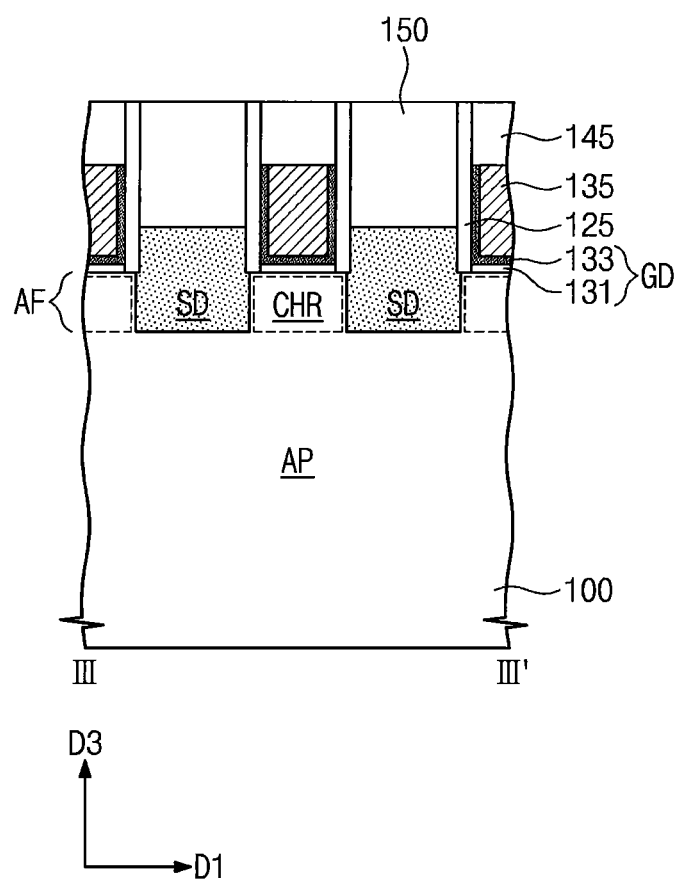

Referring to FIGS. 13A and 13B, a gate electrode 135 may be formed to at least partially fill each of the gate trenches GD by recessing the conductive layer 137. In more detail, a planarization process may be performed on the conductive layer 137 and the high-k dielectric layer 133 until a top surface of the first interlayer insulating layer 150 is exposed. Accordingly, the gate dielectric layer GD and the conductive layer 137 may be locally formed in each of the gate trenches GT. The planarization process of the conductive layer 137 and high-k dielectric layer 133 may include a CMP (chemical mechanical polishing) process.

Then, the gate electrodes 135 may be respectively formed the gate trenches GT by recessing an upper portion of the conductive layer 137. Recessing the conductive layer 137 may include performing a selective etching process with respect to the conductive layer 137. A top surface of the gate electrode 135 may be positioned at a lower level than a top surface of the first interlayer insulating layer 150 by the selective etching process. In example embodiments, a part of the high-k dielectric layer 133 that is positioned at a higher level than the top surface of the gate electrode 135 may be removed during the etching process. The high-k dielectric layer 133 may be disposed between the gate electrode 135 and the interfacial layer 131, and between the gate electrode 135 and the gate spacers 125. The gate dielectric layer GD and the gate electrode 135 may extend in the first direction D1.

A gate capping layer 145 may be subsequently formed on a top surface of the recessed gate electrode 135. The gate capping layer 145 may be formed to completely fill a recessed region of the gate electrode 135. The gate capping layer 145 may be formed of a material having etch selectivity with respect to the first interlayer insulating layer 150 and a second interlayer insulating layer 155 as described below. For example, the gate capping layer 145 may include at least one of silicon oxynitride (SiON), silicon carbide nitride (SiCN), silicon carbide oxynitride (SiCON) and silicon nitride (SiN). The gate capping layer 145 may be formed using atomic layer deposition (ALD), plasma enhanced chemical vapor deposition (PECVD) or high density plasma chemical vapor deposition (HDPCVD).

Referring back to FIGS. 2, 3A and 3B, a second interlayer insulating layer 155 may be formed on the first interlayer insulating layer 150 and the gate capping layer 145. The second interlayer insulating layer 155 may include a silicon oxide layer or a low-k oxide layer. For example, the low-k oxide layer may include a silicon oxide layer doped with carbon, such as SiCOH. The second interlayer insulating layer 155 may be formed by a chemical vapor deposition (CVD) process.

A contact hole may be formed to penetrate the second interlayer insulating layer 155 and the first interlayer insulating layer 150, and expose the source/drain region SD. For example, the contact hole may be self-aligned by the gate capping layer 145 and the gate spacer 125.

Although not shown in the drawings, a silicide layer may be formed on an upper portion of the source/drain region SD exposed through the contact hole. The silicide layer may include at least one of, for example, titanium silicide, tantalum silicide and tungsten silicide. Subsequently, a contact CA may be formed to contact the silicide layer in the contact hole. The contact CA may include a contact pillar CP and a contact barrier layer BL surrounding the contact pillar CP. More specifically, the contact barrier layer BL may be formed to partially fill the contact hole. Then, a conductive material may be formed to completely fill the contact hole and a planarization process may be performed until a top surface of the second interlayer insulating layer 155 is exposed. The contact barrier layer BL may include metal nitride such as titanium/titanium nitride. The conductive material may include metal such as tungsten.

Figure 14A:
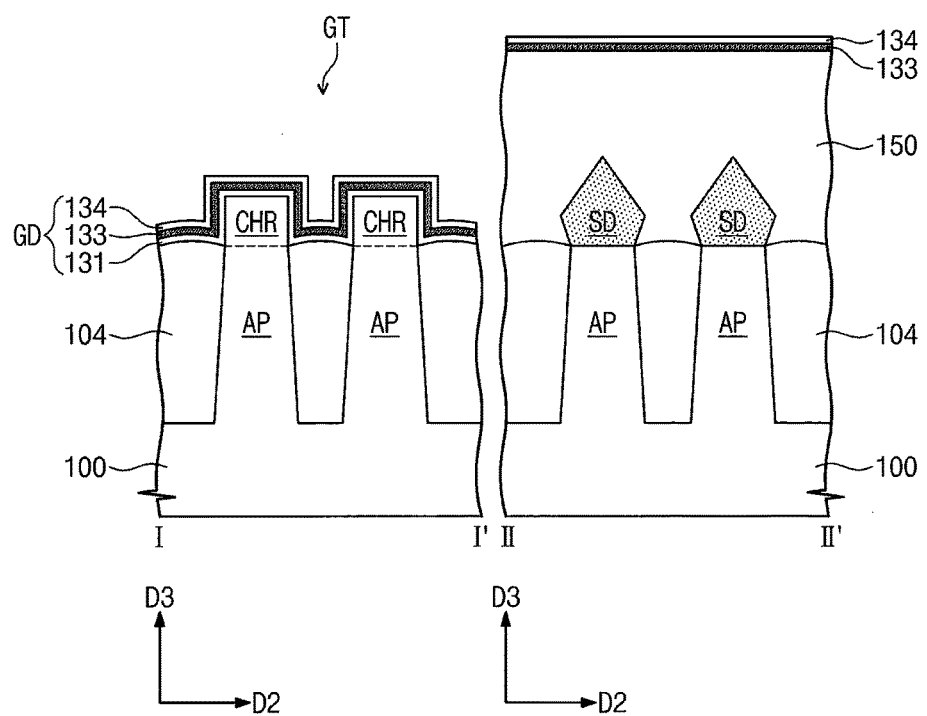
FIGS. 14A and 14B are cross-sectional views taken along lines I-I' and II-II' of FIG. 2 respectively, which are illustrated to provide a description of a method of manufacturing a semiconductor device according to example embodiments.
Figure 14B:
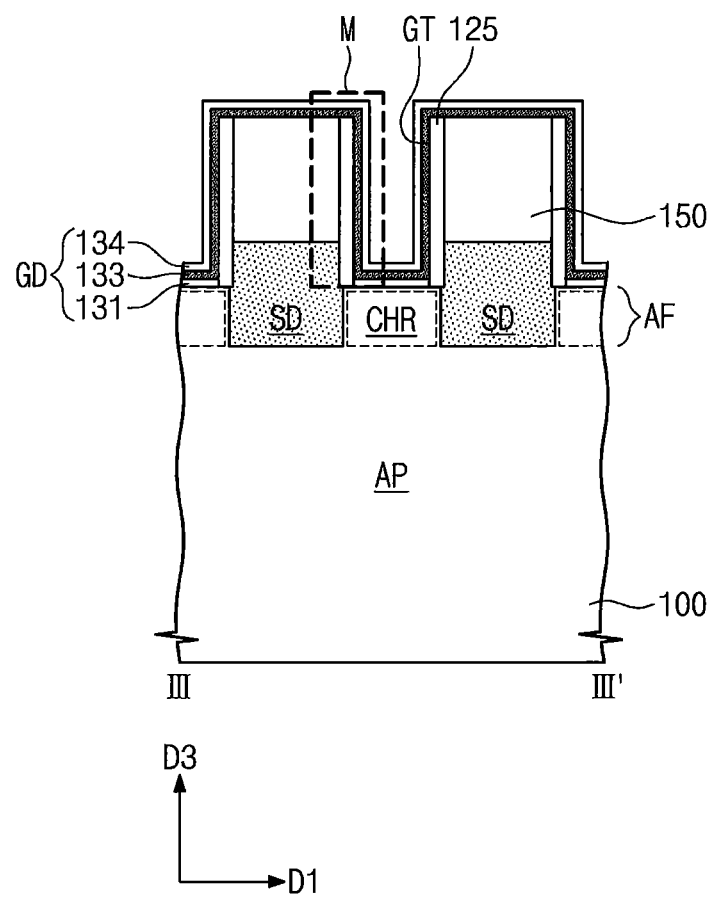
Figure 15:
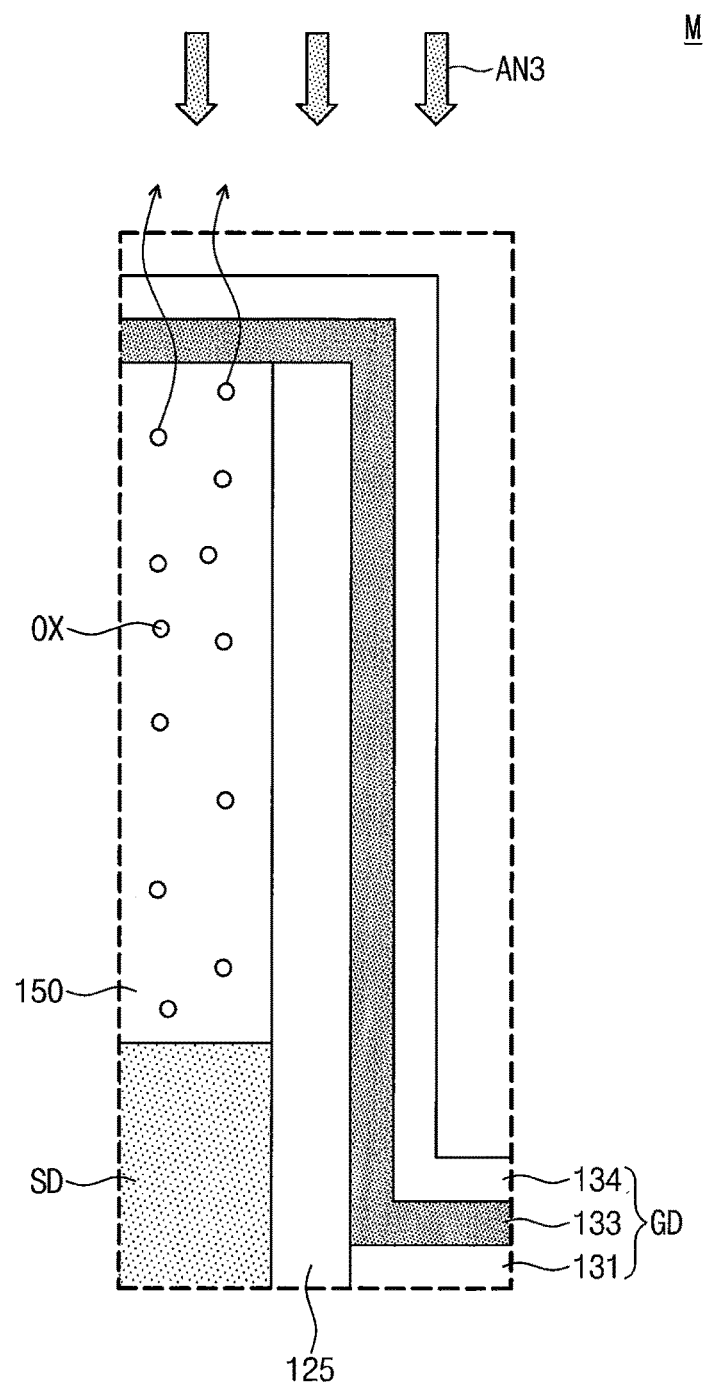
FIG. 15 is an enlarged drawing of M region shown in FIG. 14B, which is illustrated to provide a description of a heat treatment according to example embodiments.

FIGS. 14A and 14B are cross-sectional views taken along lines I-I' and II-II' of FIG. 2 respectively, and illustrate methods of manufacturing a semiconductor device according to example embodiments. FIG. 15 is an enlarged drawing of M region shown in FIG. 14B, which is illustrated to provide a description of a heat treatment according to example embodiments. In the following description, only differences will be described in detail without repeating and overlapping description of a method of manufacturing a semiconductor device previously described with reference to FIGS. 5A to 13B.

Referring to FIGS. 14A and 14B, a second high-k dielectric layer 134 may be formed on the first high-k dielectric layer 133. That is, a gate dielectric layer GD may include an interfacial layer 131, a first high-k dielectric layer 133 and a second high-k dielectric layer 134 which are sequentially stacked. The first high-k dielectric layer 133 may be the same as the high-k dielectric layer 133 previously described with reference to FIGS. 9A and 9B.

More specifically, after performing the first and second heat treatments AN1 and AN2, the second high-k dielectric layer 134 may be formed on the first high-k dielectric layer 133. For example, the second high-k dielectric layer 134 may include a high-k material, such as lanthanum oxide, and may be formed using an atomic layer deposition (ALD) process.

Then, a third heat treatment AN3 may be performed on the second high-k dielectric layer 134. The third heat treatment AN3 may be performed at the same process conditions as those of the first heat treatment AN1. Accordingly, the third heat treatment AN3 may be performed using the cluster apparatus 1 previously described with reference to FIGS. 4A and 4B. For example, the third heat treatment AN3 may be performed at a vacuum pressure ranging from 1 Torr to 40 Torr and at a temperature ranging from 400° C. to 900° C. The third heat treatment AN3 may be performed for a time of from 10 sec to 600 sec.

Materials contained in the second high-k dielectric layer 134 may be diffused into the interfacial layer 131 by the third heat treatment AN3. More specifically, if the second high-k dielectric layer 134 is formed of lanthanum oxide, the lanthanum component may be diffused into the interfacial layer 131. In this case, impurities OX remaining within the first interlayer insulating layer 150 may be discharged from the first interlayer insulating layer 150 in a manner similar to the first heat treatment AN1 described with reference to FIG. 10A. The impurities OX may not be diffused into the interfacial layer 131. The third heat treatment AN3 may be performed at a temperature that is higher than that of the first heat treatment AN1 in order to effectively diffuse the materials of the second high-k dielectric layer 134 into the interfacial layer 131. In addition, the third heat treatment AN3 may be performed at a temperature lower than that of the second heat treatment AN2.

Although not shown in the drawings, if the second heat treatment AN2 described with reference to FIG. 11 is performed before performing the third heat treatment AN3, impurities OX remaining within the first interlayer insulating layer 150 may be diffused into the interfacial layer 131 and then the interfacial layer 131 may be excessively grown.

In experiment example 3, the third heat treatment AN3 previously described with reference to FIG. 15 was performed on the second high-k dielectric layer 134. The third heat treatment AN3 was performed at a pressure of about 3 Torr and at a temperature of about 700° C. After finishing the third heat treatments AN3, a regrown thickness of the interfacial layer 131 was measured (experiment example 3).

In experiment example 4, the second heat treatment AN2 instead of the third heat treatment AN3 was performed at on the second high-k dielectric layer 134. The second heat treatment AN2 was performed at a pressure of about 1 atm and at a temperature of about 700° C. After finishing the second heat treatment AN2, a regrown thickness of the interfacial layer 131 was measured (experiment example 4). The results of the above experiment examples are shown in Table 2.

TABLE 2

|  | Experiment example 3 | Experiment example 4 |
| --- | --- | --- |
| Regrown thickness of interfacial layer | 0.2 Å | 1 Å |

As shown in Table 2, a regrowth of the interfacial layer 131 may be significantly reduced as compared to the atmospheric pressure by performing the third heat treatment AN3 at a vacuum condition.

In other embodiments, the second high-k dielectric layer 134 may be formed before performing the first and second heat treatments AN1 and AN2. In this case, the third heat treatment AN3 may be performed on the gate dielectric layer GD. Then, the second heat treatment AN2 may be selectively performed at an atmospheric pressure and at a high temperature. In still other embodiments, the second high-k dielectric layer may be formed after only the second heat treatment AN2 is performed, as illustrated in FIG. 11. Then, the third heat treatment AN3 may be performed.

Then, a gate electrode 135 and a gate capping layer 145 may be formed on the gate dielectric layer GD. This may be performed to be similar to the methods described above with reference to FIGS. 12A to 13A and 12B to 13B.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of forming a semiconductor device, comprising:

forming a device isolation layer defining an active pattern on an upper portion of a substrate;

forming a sacrificial gate pattern on the active pattern;

forming spacers on opposite sidewalls of the sacrificial gate pattern;

forming an interlayer insulating layer on the active pattern and the spacers;

removing the sacrificial gate pattern to form a gate trench defined by the spacers, the gate trench exposing a region of the active pattern;

forming a gate dielectric layer on the region of the active pattern exposed by the gate trench;

removing impurities from the interlayer insulating layer by performing a first heat treatment;

performing a second heat treatment on the gate dielectric layer, wherein the second heat treatment is performed at a temperature that is greater than a temperature of the first heat treatment; and forming a gate electrode in the gate trench, wherein the first heat treatment is performed at a pressure of less than 1 atm.

2. The method of claim 1, wherein forming the gate dielectric layer comprises:

forming an interfacial layer on the region of the active pattern; and forming a high-k dielectric layer on the interfacial layer.

3. The method of claim 2, wherein forming the interfacial layer comprises performing at least one of a thermal oxidation process and a chemical oxidation process on the region of the active pattern exposed by the gate trench and growing the interfacial layer from the region of the active pattern exposed by the gate trench.

4. The method of claim 2, wherein the high-k dielectric layer directly contacts sidewalls of the spacers.

5. The method of claim 2, wherein performing the second heat treatment comprises diffusing materials contained in the high-k dielectric layer into the interfacial layer.

6. The method of claim 2, wherein forming the high-k dielectric layer comprises forming a first high-k dielectric layer and a second high-k dielectric layer on the first high-k dielectric layer, and wherein the second high-k dielectric layer is formed after performing the second heat treatment.

7. The method of claim 6, further comprising:

performing a third heat treatment on the second high-k dielectric layer, wherein the third heat treatment is performed at a temperature greater than the temperature of the first heat treatment and lower than the temperature of the second heat treatment.

8. The method of claim 1, wherein the first heat treatment is performed at a pressure ranging from 1 Torr to 40 Torr and at a temperature ranging between 400° C. and 900° C.

9. The method of claim 1, wherein the impurities comprise at least one of oxygen ($O_2$) and water vapor ($H_2O$).

10. The method of claim 1, wherein the second heat treatment is performed at a temperature between 700° C. and 1200° C.

11. The method of claim 1, wherein a thickness of the gate dielectric layer is increased by an amount from 0.1 Å to 0.5 Å during performing the second heat treatment.

12. The method of claim 1, wherein the active pattern comprises an active fin that protrudes between the device isolation layers.

13. A method of forming a semiconductor device, comprising:

forming an interlayer insulating layer on an active pattern of a substrate;

forming a gate trench in the interlayer insulating layer, the gate trench exposing a region of the active pattern;

sequentially forming an interfacial layer and a high-k dielectric layer on the region of the active pattern that is exposed by the gate trench; and performing a first heat treatment at a pressure of from 1 Torr to 40 Torr and at a temperature of from 400° C. to 900° C.

14. The method of claim 13, wherein performing the first heat treatment comprises removing impurities including at least one of oxygen ($O_2$) and water vapor ($H_2O$) from the interlayer insulating layer.

15. The method of claim 13, further comprising:

performing a second heat treatment on the high-k dielectric layer.

16. The method of claim 15, wherein the second heat treatment is performed at an atmospheric pressure and at a temperature ranging from 700° C. to 1200° C.

17. The method of claim 13, further comprising:

forming a device isolation trench that defines the active pattern by etching an upper portion of the substrate before forming the interlayer insulating layer; and forming a device isolation layer in the device isolation trench.

18. The method of claim 17, further comprising:

recessing the device isolation layer to expose an upper portion of the active pattern.

19. A method of manufacturing of a semiconductor device comprising:

forming an interlayer insulating layer on an active pattern of a substrate;

forming a gate trench in the interlayer insulating layer, the gate trench exposing a region of the active pattern;

forming a gate dielectric layer on the region of the active pattern exposed by the gate trench;

transferring the substrate to a load lock chamber that is under a vacuum;

transferring the substrate from the load lock chamber to a process chamber that is under a vacuum and performing a first heat treatment on the substrate in the process chamber; and forming a gate electrode in the gate trench on the gate dielectric layer, wherein a pressure within the process chamber is controlled at a pressure of from 1 Torr to 40 Torr for performing the first heat treatment.

20. The method of claim 19, further comprising:

performing a second heat treatment on the substrate after performing the first heat treatment and after releasing the vacuum in the load lock chamber.

* * * * *